(12) United States Patent
Fukuura et al.

(10) Patent No.: US 12,522,742 B2
(45) Date of Patent: *Jan. 13, 2026

(54) PHOTOSENSITIVE COMPOSITION

(71) Applicant: SUMITOMO CHEMICAL COMPANY, LIMITED, Tokyo (JP)

(72) Inventors: Tomohiro Fukuura, Osaka (JP); Yoshihiro Harada, Osaka (JP); Yoshifumi Komatsu, Osaka (JP); Masayoshi Tokuda, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/214,952

(22) Filed: Jun. 27, 2023

(65) Prior Publication Data

US 2023/0340289 A1 Oct. 26, 2023

Related U.S. Application Data

(63) Continuation of application No. 17/787,288, filed as application No. PCT/JP2020/048162 on Dec. 23, 2020, now Pat. No. 12,338,357.

(30) Foreign Application Priority Data

Dec. 26, 2019 (JP) .................... 2019-237347

(51) Int. Cl.
*C09D 11/52* (2014.01)
*C09D 11/03* (2014.01)
(Continued)

(52) U.S. Cl.
CPC .............. *C09D 11/52* (2013.01); *C09D 11/03* (2013.01); *C09D 11/101* (2013.01);
(Continued)

(58) Field of Classification Search
CPC .................................................... C09D 11/101
See application file for complete search history.

(56) References Cited

U.S. PATENT DOCUMENTS 4,234,626 A 11/1980 Peiffer
4,594,400 A 6/1986 Kvita et al.
(Continued)

FOREIGN PATENT DOCUMENTS

CN 1625573 A 6/2005
CN 102732091 A 10/2012
(Continued)

OTHER PUBLICATIONS

European Extended Search Report issued in corresponding European Patent Application No. 23153593.1 dated Sep. 25, 2023 (15 pages).

(Continued)

*Primary Examiner* — Khanh T Nguyen
(74) *Attorney, Agent, or Firm* — Foley & Lardner LLP

(57) ABSTRACT

The photosensitive composition according to the present invention is a photosensitive composition including a semiconductor particle (A), a photopolymerizable compound (C) and a photopolymerization initiator (D), in which the photosensitive composition satisfies any one or more of the following (a) to (c): (a) the photosensitive composition further includes a stabilizer (E), and a content of the stabilizer (E) is 8% by mass or more based on the total amount of the photosensitive composition; (b) the photopolymerizable compound (C) includes a (meth)acrylate compound (C1) having a molecular weight of 180 or less; and (c) the photopolymerizable compound (C) includes a compound (C2) having a vinyl ether group and a (meth)acryloyl group in the same molecule.

17 Claims, 2 Drawing Sheets

(51) Int. Cl.
*C09D 11/101* (2014.01)
*C09D 11/107* (2014.01)
*C09D 11/38* (2014.01)
*G02B 5/20* (2006.01)

(52) U.S. Cl.
CPC ............ *C09D 11/107* (2013.01); *C09D 11/38* (2013.01); *G02B 5/20* (2013.01)

(56) References Cited

U.S. PATENT DOCUMENTS

| | | |
|---|---|---|
| 2003/0199655 A1 | 10/2003 | Yurugi et al. |
| 2012/0133059 A1 | 5/2012 | Ito et al. |
| 2012/0189822 A1 | 7/2012 | Ito et al. |
| 2012/0252919 A1 | 10/2012 | Suzuki et al. |
| 2013/0141504 A1 | 6/2013 | Saito et al. |
| 2013/0286121 A1 | 10/2013 | Fukumoto et al. |
| 2016/0002379 A1 | 1/2016 | Kitajima et al. |
| 2017/0205664 A1 | 7/2017 | Cho et al. |
| 2018/0072047 A1 | 3/2018 | Fukumoto et al. |
| 2018/0105739 A1 | 4/2018 | Kim et al. |
| 2019/0227431 A1 | 7/2019 | Park et al. |
| 2019/0390076 A1 | 12/2019 | Isonaka et al. |
| 2020/0239713 A1 | 7/2020 | Kanesaka et al. |
| 2020/0341375 A1 | 10/2020 | Okawara et al. |
| 2021/0024765 A1 | 1/2021 | Tan et al. |
| 2021/0040383 A1 | 2/2021 | Yahata et al. |
| 2021/0087421 A1 | 3/2021 | Bruccoleri et al. |

FOREIGN PATENT DOCUMENTS

| | | | | |
|---|---|---|---|---|
| CN | 103131260 | A | | 6/2013 |
| CN | 105026027 | A | | 11/2015 |
| CN | 105652594 | A | | 6/2016 |
| CN | 106569389 | A | | 4/2017 |
| CN | 106795228 | A | | 5/2017 |
| CN | 106990606 | A | | 7/2017 |
| CN | 107429104 | A | | 12/2017 |
| CN | 107652776 | A | | 2/2018 |
| CN | 108121158 | A | * 6/2018 | ............. G03F 7/004 |
| JP | 2012-116928 | A | | 6/2012 |
| JP | 2012-144682 | A | | 8/2012 |
| JP | 2012-207084 | A | | 10/2012 |
| JP | 2013-240979 | A | | 12/2013 |
| JP | 2016-071362 | A | | 5/2016 |
| JP | 2016-110065 | A | | 6/2016 |
| JP | 2018-193525 | A | | 12/2018 |
| JP | 2019-026779 | A | | 2/2019 |
| JP | 2019-026780 | A | | 2/2019 |
| JP | 2019-056111 | A | | 4/2019 |
| KR | 2013-0019055 | A | | 2/2013 |
| KR | 102047361 | B1 | | 11/2019 |
| TW | 201938758 | A | | 10/2019 |
| TW | 201942331 | A | | 11/2019 |
| WO | WO-2016/035602 | A1 | | 3/2016 |
| WO | WO-2018/123103 | A1 | | 7/2018 |
| WO | WO-2018/123821 | A1 | | 7/2018 |
| WO | WO-2019/022195 | A1 | | 1/2019 |
| WO | WO-2019/159950 | A1 | | 8/2019 |
| WO | WO-2019/189495 | A1 | | 10/2019 |
| WO | WO-2019/216961 | A1 | | 11/2019 |
| WO | WO-2013/024929 | A1 | | 2/2023 |

OTHER PUBLICATIONS

European Partial Search Report issued in corresponding European Patent Application No. 23153593.1 dated Jun. 22, 2023 (49 pages).
Office Action issued in corresponding Japanese Patent Application No. 2020-207821, dated Sep. 26, 2023.
Office Action issued in related Japanese Patent Application No. 2020-207821, dated Jul. 11, 2023.
Office Action issued in corresponding Chinese Patent Application No. 202211251917X, dated Jun. 7, 2023.
Office Action issued in related Japanese Patent Application No. 2022-109807, dated Jul. 11, 2023.
Office Action issued in corresponding Japanese Patent Application No. 2022-109808, dated Jul. 11, 2023.
Office Action issued in corresponding Chinese Patent Application No. 202211251917.X dated Nov. 17, 2023 (30 pages).
Silicate Dictionary, 1st edition, Jun. 1984, China Construction Industry Press, etc., p. 977, China Construction Industry Press.
Office Action issued in related Chinese Patent Application No. 202211251883.4, dated Jun. 30, 2023.
International Searching Authority, "International Search Report," issued in connection with International Patent Application No. PCT/JP2020/048162, dated Feb. 9, 2021.
International Searching Authority, "Written Opinion," issued in connection with International Patent Application No. PCT/JP2020/048162, dated Feb. 9, 2021.
European Patent Office, "Communication with European Search Report," issued in connection with European Patent Application No. 20 906 464.1, dated Jun. 5, 2023.
European Patent Office, "Communication with European Search Report," issued in connection with European Patent Application No. 23 15 3604.6, dated May 26, 2023.
Office Action issued in corresponding Chinese Patent Application No. 202211251883.4 dated Mar. 15, 2024 (13 pages).
Office Action issued in corresponding Chinese Patent Application No. 202211251883.4 dated Dec. 28, 2023 (13 pages).
Office Action issued in corresponding Chinese Patent Application No. 202080089380.4 dated Mar. 21, 2024 (9 pages).
Office Action issued in corresponding Chinese Patent Application No. 202211251917.X dated Feb. 28, 2024 (17 pages).
Office Action issued in corresponding Taiwanese Patent Application No. 109145386 dated Mar. 8, 2024 (19 pages).
Office Action issued in corresponding Taiwanese Patent Application No. 111123139 dated Apr. 11, 2024 (11 pages).
Office Action issued in corresponding Chinese Patent Application No. 202211251883.4 dated May 27, 2024 (15 pages).
Wikipedia, "Propylene glycol methyl ether acetate", retrieved from the Internet: https://en.wikipedia.org/w/index.php?title=Propylene_glycol_methyl_ether_acetate&oldid=1256543964, last edited on Nov. 10, 2024, pp. 1-3.
Wikipedia, "Propylene glycol methyl ether", retrieved from the Internet: https://en.wikipedia.org/w/index.php?title=Propylene_glycol_methyl_ether&oldid=1215522218, last edited on Mar. 25, 2024, pp. 1-2.

\* cited by examiner

[Figure 1]
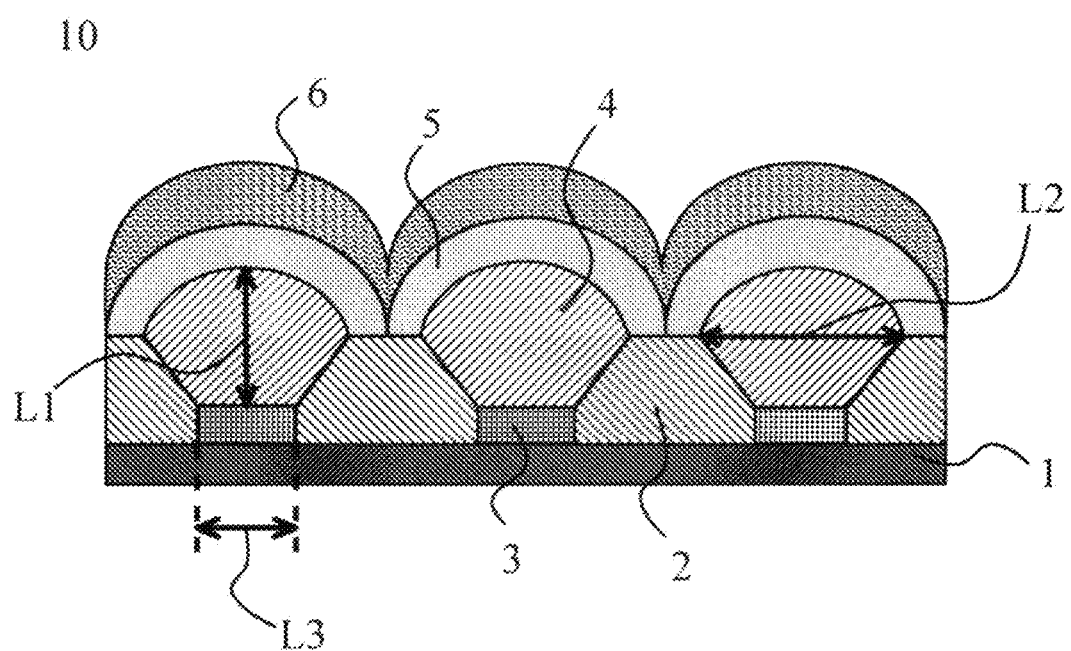

[Figure 2]
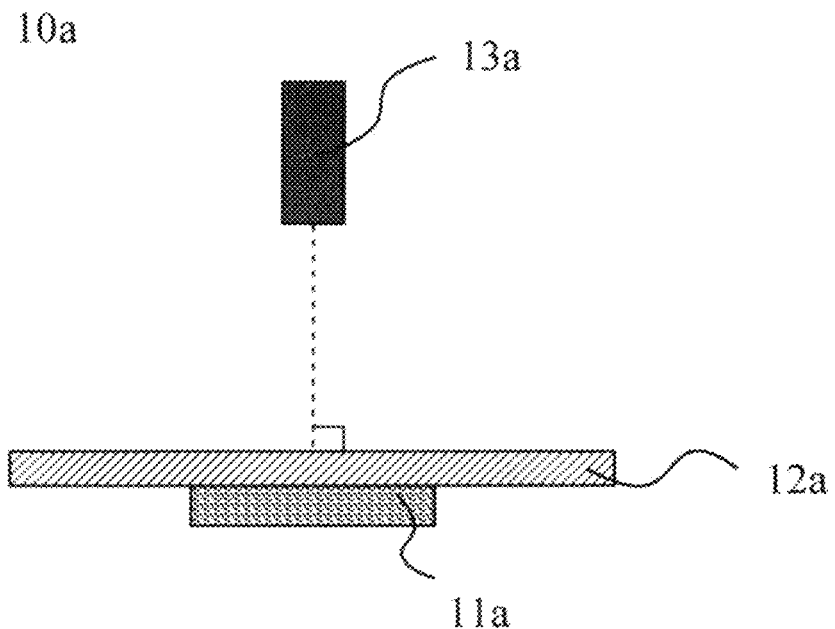
[Figure 3]
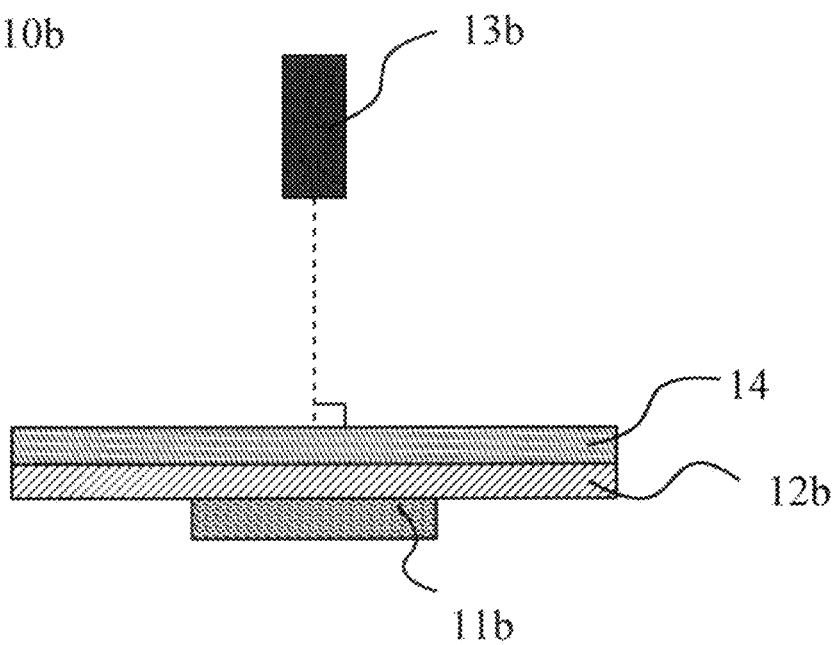

PHOTOSENSITIVE COMPOSITION

CROSS-REFERENCE TO RELATED APPLICATIONS

The present application is a Continuation of U.S. patent application Ser. No. 17/787,288, filed on Jun. 17, 2022, which claims priority under 37 U.S.C. § 371 to International Patent Application No. PCT/JP2020/048162, filed Dec. 23, 2020, which claims priority to and the benefit of Japanese Patent Application No. 2019-237347, filed on Dec. 26, 2019. The contents of these applications are hereby incorporated by reference in their entireties.

TECHNICAL FIELD

The present invention relates to a photosensitive composition, and particularly relates to a photosensitive composition suitable for an ink for an ink-jet printer.

BACKGROUND ART

A curable resin composition containing a semiconductor particle such as a semiconductor quantum dot is known as a curable resin composition for formation of a cured film such as a wavelength conversion film included in a display device such as an image display device (Patent Literature 1). A method for producing a wavelength conversion film or the like with an ink composition including a semiconductor quantum dot, according to an ink-jet method, is studied (Patent Literatures 2 and 3).

CITATION LIST

Patent Literature

Patent Literature 1: Japanese Patent Laid-Open No. 2016-71362
Patent Literature 2: International Publication No. WO 2018/123821
Patent Literature 3: International Publication No. WO 2018/123103

SUMMARY OF INVENTION

Technical Problem

A semiconductor particle such as a semiconductor quantum dot is weak against heat, and a cured film such as a wavelength conversion film formed from a photosensitive composition including such a semiconductor particle may be sometimes demanded to be enhanced in heat resistance. Furthermore, such a photosensitive composition may also be sometimes demanded to have more favorable coatability.

An object of the present invention is to provide a photosensitive composition including a semiconductor particle, the photosensitive composition being favorable in heat resistance and/or coatability.

Solution to Problem

The present invention is as described below.
[1] A photosensitive composition including a semiconductor particle (A), a photopolymerizable compound (C), a photopolymerization initiator (D) and a stabilizer (E), wherein
a content of the stabilizer (E) is 8% by mass or more based on the total amount of the photosensitive composition.
[2] A photosensitive composition including a semiconductor particle (A), a photopolymerizable compound (C) and a photopolymerization initiator (D), wherein
the photopolymerizable compound (C) includes a (meth)acrylate compound (C1) having a molecular weight of 180 or less.
[3] A photosensitive composition including a semiconductor particle (A), a photopolymerizable compound (C) and a photopolymerization initiator (D), wherein
the photopolymerizable compound (C) includes a compound (C2) having a vinyl ether group and a (meth)acryloyl group in the same molecule.
[4] The photosensitive composition according to any one of [1] to [3], wherein the photopolymerizable compound (C) includes a (meth)acrylate compound (C1) having a molecular weight of 180 or less.
[5] The photosensitive composition according to any one of [1] to [4], wherein the photopolymerizable compound (C) includes a compound (C2) having a vinyl ether group and a (meth)acryloyl group in the same molecule.
[6] The photosensitive composition according to any one of [1] to [5], wherein
the photosensitive composition further includes a stabilizer (E), and
the content of the stabilizer (E) is 8% by mass or more based on the total amount of the photosensitive composition.
[7] The photosensitive composition according to any one of [1] to [6], wherein the compound (C1) has a viscosity at 25° C. of 1.2 cP or less.
[8] The photosensitive composition according to any one of [1] to [7]1, wherein a content of the compound (C1) is 5% by mass or more and 50% by mass or less based on the total amount of the photosensitive composition.
[9] The photosensitive composition according to any one of [1] to [8], wherein a content of the compound (C2) is 5% by mass or more and 50% by mass or less based on the total amount of the photosensitive composition.
[10] The photosensitive composition according to any one of [1] to [9], wherein the content of the stabilizer (E) is 16% by mass or more based on the total amount of the photosensitive composition.
[11] The photosensitive composition according to any one of [1] to [10], wherein a content of the semiconductor particle (A) is 16% by mass or more and 45% by mass or less based on the total amount of the photosensitive composition.
[12] The photosensitive composition according to any one of [1] to [11], wherein the photopolymerizable compound (C) includes a compound (C3) having a carboxy group and three or more functional groups other than a carboxy group in the same molecule.
[13] The photosensitive composition according to [12], wherein a content of the compound (C3) is 25 parts by mass or more and 100 parts by mass or less based on 100 parts by mass of the semiconductor particle (A).
[14] The photosensitive composition according to any one of [1] to [13], wherein a viscosity at 40° C. of the photosensitive composition is 20 cP or less.
[15] The photosensitive composition according to any one of [1] to [14], wherein a content of the photopolymerization initiator (D) is 8 parts by mass or more and 50 parts by mass or less based on 100 parts by mass of the photopolymerizable compound (C).

[16] The photosensitive composition according to any one of [1] to [15], wherein the photosensitive composition further includes a light scattering agent (B) having a median size on a volume basis, of 0.15 μm or more.

[17] The photosensitive composition according to any one of [1] to [16], wherein
the photosensitive composition further includes a solvent (F), and
a content of the solvent (F) is 3.5% by mass or less based on the total amount of the photosensitive composition.

[18] The photosensitive composition according to any one of [1] to [17], wherein the photosensitive composition is an ink for an ink-jet printer.

[19] Use of the photosensitive composition according to [18], for discharge at a temperature of 40° C. or more through a discharge head of an ink-jet printer.

[20] A cured film formed from the photosensitive composition according to any one of [1] to [18].

[21] The cured film according to [20], having a vertical dimension of 9 μm or more and/or a horizontal dimension of 10 μm or more and 900 μm or less.

Advantageous Effect of Invention

According to the present invention, a photosensitive composition favorable in heat resistance and/or coatability can be provided.

BRIEF DESCRIPTION OF DRAWINGS

FIG. 1 is a schematic cross-sectional view illustrating one example of a display member.

FIG. 2 is a device conceptual view illustrating a first optical system for use in measurement of an external quantum yield.

FIG. 3 is a device conceptual view illustrating a second optical system for use in measurement of an external quantum yield.

DESCRIPTION OF EMBODIMENTS

<Photosensitive Composition>

The photosensitive composition according to the present invention is a photosensitive composition including a semiconductor particle (A), a photopolymerizable compound (C) and a photopolymerization initiator (D), in which the photosensitive composition satisfies any one or more of the following (a) to (c): (a) the photosensitive composition further includes a stabilizer (E), and the content of the stabilizer (E) is 8% by mass or more based on the total amount of the photosensitive composition, (b) the photopolymerizable compound (C) includes a (meth)acrylate compound (C1) having a molecular weight of 180 or less, and (c) the photopolymerizable compound (C) includes a compound (C2) having a vinyl ether group and a (meth)acryloyl group in the same molecule.

The photosensitive composition of the present invention may satisfy any one of (a) to (c) described above, may satisfy any two of (a) to (c) described above, or may satisfy all (a) to (c) described above.

Herein, any compound exemplified as each component which is included or can be included in the photosensitive composition may be used singly or plural kinds thereof, unless not particularly noted.

<Semiconductor Particle (A)>

The semiconductor particle (A) is preferably a light-emitting (fluorescent emitting) semiconductor particle. A cured film such as a wavelength conversion film formed from a photosensitive composition including a light-emitting semiconductor particle can exhibit fluorescent emission in a desired wavelength region and be excellent in color reproducibility.

The semiconductor particle (A) may be a red-emitting semiconductor particle having an emission peak wavelength in the range from 605 to 665 nm, may be a green-emitting semiconductor particle having an emission peak wavelength in the range from 500 to 560 nm, or may be a blue-emitting semiconductor particle having an emission peak wavelength in the range from 420 to 480 nm. The light absorbed by the semiconductor particle (A) may be, for example, light (blue light) at a wavelength in the range of 400 nm or more and less than 500 nm or light (ultraviolet light) at a wavelength in the range from 200 nm to 400 nm. The emission peak wavelength of the semiconductor particle (A) can be, for example, confirmed in an emission spectrum measured with an ultraviolet-visible spectrophotometer.

The full width at half maximum of an emission spectrum of the semiconductor particle (A) is preferably 60 nm or less, more preferably 55 nm or less, further preferably 50 nm or less, particularly preferably 45 nm or less. Thus, light higher in color purity can be obtained. The lower limit of the full width at half maximum of an emission spectrum of the semiconductor particle (A) is not particularly limited, and may be 5 nm or more or may be 15 nm or more.

The emitting semiconductor particle is a particle including a semiconductor crystal, preferably a nanoparticle including a semiconductor crystal. Preferable examples of the emitting semiconductor particle include a semiconductor quantum dot and a compound having a perovskite-type crystal structure (hereinafter, referred to as "perovskite compound"), and a semiconductor quantum dot is more preferable.

The semiconductor quantum dot has an average particle size of, for example, 0.5 nm or more and 20 nm or less, preferably 1 nm or more and 15 nm or less (for example, 2 nm or more and 15 nm or less). The average particle size of the semiconductor quantum dot can be determined with a transmission electron microscope (TEM).

The semiconductor quantum dot can be constituted from, for example, a semiconductor material including one or more elements selected from the group consisting of Group 2 elements, Group 11 elements, Group 12 elements, Group 13 elements, Group 14 elements, Group 15 elements and Group 16 elements in the Periodic Table.

Specific examples of the semiconductor material which can constitute the semiconductor quantum dot include compounds of Group 14 elements and Group 16 elements, such as $SnS_2$, SnS, SnSe, SnTe, PbS, PbSe and PbTe; compounds of Group 13 elements and Group 15 elements, such as GaN, GaP, GaAs, GaSb, InN, InP, InAs, InSb, InGaN and InGaP; compounds of Group 13 elements and Group 16 elements, such as $Ga_2O_3$, $Ga_2S_3$, $Ga_2Se_3$, $Ga_2Te_3$, $In_2O_3$, $In_2S_3$, $In_2Se_3$ and $In_2Te_3$; compounds of Group 12 elements and Group 16 elements, such as ZnO, ZnS, ZnSe, ZnTe, CdO, CdS, CdSe, CdTe, HgO, HgS, HgSe, HgTe, ZnSTe, ZnSeS, ZnSeTe, CdSTe, CdSeTe, HgSTe, HgSeS and HgSeTe; compounds of Group 15 elements and Group 16 elements, such as $As_2O_3$, $As_2S_3$, $As_2Se_3$, $As_2Te_3$, $Sb_2O_3$, $Sb_2S_3$, $Sb_2Se_3$, $Sb_2Te_3$, $Bi_2O_3$, $Bi_2S_3$, $Bi_2Se_3$ and $Bi_2Te_3$; compounds of Group 2 elements and Group 16 elements, such as MgS, MgSe, MgTe, CaS, CaSe, CaTe, SrS, SrSe, SrTe, BaS, BaSe and BaTe; and single substances of Group 14 elements, Group 15 elements or Group 16 elements, such as Si and Ge.

The semiconductor quantum dot may have a monolayer structure including a single semiconductor material, or may have a core-shell structure in which the surface of a core particle (core layer) including a single semiconductor material is covered with a covering layer (shell layer) including one or more semiconductor materials different from such a single semiconductor material. In the latter case, the semiconductor material(s) used for constituting the shell layer is/are usually larger in band gap energy than the semiconductor material used for constituting the core layer. The semiconductor quantum dot may have two or more kinds of such shell layers. The shape of the semiconductor quantum dot is not particularly limited, and can be, for example, a spherical or substantially spherical, rod, or disc shape.

The perovskite compound is a compound having a perovskite-type crystal structure with A, B and X as components.

A is a component positioned at each vertex of a hexahedron with B as the center in the perovskite-type crystal structure, and is a monovalent cation.

X is a component positioned at each vertex of an octahedron with B as the center in the perovskite-type crystal structure, and is at least one ion selected from the group consisting of a halide ion and a thiocyanate ion.

B is a component positioned at the center between the hexahedron with A located as each vertex and the octahedron with X located as each vertex in the perovskite-type crystal structure, and is a metal ion.

The average particle size of the perovskite compound is preferably 3 nm or more, more preferably 4 nm or more, further preferably 5 nm or more from the viewpoint that the crystal structure is favorably maintained. The average particle size of the perovskite compound is preferably 5 μm or less, more preferably 500 nm or less, further preferably 100 nm or less from the viewpoint that precipitation of the perovskite compound in the photosensitive composition is suppressed. The average particle size of the perovskite compound can be determined with a transmission electron microscope (TEM).

The perovskite compound with A, B and X as components is not particularly limited, and may be a compound having any structure of a three-dimensional structure, a two-dimensional structure, and a quasi-two-dimensional structure.

In the case of a three-dimensional structure, the perovskite compound is represented by $ABX_{(3+\delta)}$.

In the case of a two-dimensional structure, the perovskite compound is represented by $A_2BX_{(4+\delta)}$.

Herein, δ is a number which can be appropriately changed depending on the charge balance of B, and is −0.7 or more and 0.7 or less.

Specific examples of a compound which is the perovskite compound, which is represented by $ABX_{(3+\delta)}$ and which has a perovskite-type crystal structure of a three-dimensional structure preferably include $CH_3NH_3PbBr_3$, $CH_3NH_3PbCl_3$, $CH_3NH_3PbI_3$, $CH_3NH_3PbBr_{(3-y)}I_y$ (0<y<3), $CH_3NH_3PbBr_{(3-y)}Cl_y$ (0<y<3), $(H_2N=CH-NH_2)PbBr_3$, $(H_2N=CH-NH_2)PbCl_3$, $(H_2N=CH-NH_2)PbI_3$,
$CH_3NH_3Pb_{(1-a)}Ca_aBr_3$ (0<a≤0.7), $CH_3NH_3Pb_{(1-a)}Sr_aBr_3$ (0<a≤0.7), $CH_3NH_3Pb_{(1-a)}La_aBr_{(3+\delta)}$ (0<a≤0.7, 0<δ≤0.7), $CH_3NH_3Pb_{(1-a)}Ba_aBr_3$ (0<a≤0.7), $CH_3NH_3Pb_{(1-a)}Dy_aBr_{(3+\delta)}$ (0<a≤0.7, 0<δ≤0.7), $CH_3NH_3Pb_{(1-a)}Na_aBr_{(3+\delta)}$ (0<a≤0.7, −0.7≤δ<0), $CH_3NH_3Pb_{(1-a)}Li_aBr_{(3+\delta)}$ (0<a≤0.7, −0.7≤δ<0),
$CsPb_{(1-a)}Na_aBr_{(3+\delta)}$ (0<a≤0.7, −0.7≤δ<0), $CsPb_{(1-a)}Li_aBr_{(3+\delta)}$ (0<a≤0.7, −0.7≤δ<0),
$CH_3NH_3Pb_{(1-a)}Na_aBr_{(3+\delta-y)}I_y$ (0<a≤0.7, −0.7≤δ<0, 0<y<3), $CH_3NH_3Pb_{(1-a)}Li_aBr_{(3+\delta-y)}I_y$ (0<a≤0.7, −0.7≤δ<0, 0<y<3), $CH_3NH_3Pb_{(1-a)}Na_aBr_{(3+\delta-y)}Cl_y$ (0<a≤0.7, −0.7≤δ<0, 0<y<3), $CH_3NH_3Pb_{(1-a)}Li_aBr_{(3+\delta-y)}Cl_y$ (0<a≤0.7, −0.7≤δ<0, 0<y<3),
$(H_2N=CH-NH_2)Pb_{(1-a)}Na_aBr_{(3+\delta)}$ (0<a≤0.7, −0.7≤δ<0), $(H_2N=CH-NH_2)Pb_{(1-a)}Li_aBr_{(3+\delta)}$ (0<a≤0.7, −0.7≤δ<0), $(H_2N=CH-NH_2)Pb_{(1-a)}Na_aBr_{(3+\delta-y)}I_y$ (0<a≤0.7, −0.7≤δ<0, 0<y<3), $(H_2N=CH-NH_2)Pb_{(1-a)}Na_aBr_{(3+\delta-y)}Cl_y$ (0<a≤0.7, −0.7≤δ<0, 0<y<3),
$CsPbBr_3$, $CsPbCl_3$, $CsPbI_3$, $CsPbBr_{(3-y)}I_y$ (0<y<3), $CsPbBr_{(3-y)}Cl_y$ (0<y<3), $CH_3NH_3PbBr_{(3-y)}Cl_y$ (0<y<3),
$CH_3NH_3Pb_{(1-a)}Zn_aBr_3$ (0<a≤0.7), $CH_3NH_3Pb_{(1-a)}Al_aBr_{(3+\delta)}$ (0<a≤0.7, 0≤δ≤0.7), $CH_3NH_3Pb_{(1-a)}CO_aBr_3$ (0<a≤0.7), $CH_3NH_3Pb_{(1-a)}Mn_aBr_3$ (0<a≤0.7), $CH_3NH_3Pb_{(1-a)}Mg_aBr_3$ (0<a≤0.7),
$CsPb_{(1-a)}Zn_aBr_3$ (0<a≤0.7), $CSPb_{(1-a)}Al_aBr_{(3+\delta)}$ (0<a≤0.7, 0<δ≤0.7), $CsPb_{(1-a)}CO_aBr_3$ (0<a≤0.7), $CsPb_{(1-a)}Mn_aBr_3$ (0<a≤0.7), $CsPb_{(1-a)}Mg_aBr_3$ (0<a≤0.7),
$CH_3NH_3Pb_{(1-a)}Zn_aBr_{(3-y)}I_y$ (0<a≤0.7, 0<y<3), $CH_3NH_3Pb_{(1-a)}Al_aBr_{(3+\delta-y)}I_y$ (0<a≤0.7, 0<δ≤0.7, 0<y<3), $CH_3NH_3Pb_{(1-a)}CO_aBr_{(3-y)}I_y$ (0<a≤0.7, 0<y<3), $CH_3NH_3Pb_{(1-a)}Mn_aBr_{(3-y)}I_y$ (0<a≤0.7, 0<y<3), $CH_3NH_3Pb_{(1-a)}Mg_aBr_{(3-y)}I_y$ (0<a≤0.7, 0<y<3), $CH_3NH_3Pb_{(1-a)}Zn_aBr_{(3-y)}Cl_y$ (0<a≤0.7, 0<y<3), $CH_3NH_3Pb_{(1-a)}Al_aBr_{(3+\delta-y)}Cl_y$ (0<a≤0.7, 0<δ≤0.7, 0<y<3), $CH_3NH_3Pb_{(1-a)}CO_aBr_{(3+\delta-y)}Cl_y$ (0<a≤0.7, 0<y<3), $CH_3NH_3Pb_{(1-a)}Mn_aBr_{(3-y)}Cl_y$ (0<a≤0.7, 0<y<3), $CH_3NH_3Pb_{(1-a)}Mg_aBr_{(3-y)}Cl_y$ (0<a≤0.7, 0<y<3),
$(H_2N=CH-NH_2)Zn_aBr_3$ (0<a≤0.7), $(H_2N=CH-NH_2)Mg_aBr_3$ (0<a≤0.7), $(H_2N=CH-NH_2)Pb_{(1-a)}Zn_aBr_{(3-y)}I_y$ (0<a≤0.7, 0<y<3), $(H_2N=CH-NH_2)Pb_{(1-a)}>Zn_aBr_{(3-y)}Cl_y$ (0<a≤0.7, 0<y<3).

Specific examples of a compound which is the perovskite compound, which is represented by $A_2BX_{(4+\delta)}$ and which has a perovskite-type crystal structure of a two-dimensional structure preferably include $(C_4H_9NH_3)_2PbBr_4$, $(C_4H_9NH_3)_2PbCl_4$, $(C_4H_9NH_3)_2PbI_4$, $(C_7H_{15}NH_3)_2PbBr_4$, $(C_7H_{15}NH_3)_2PbCl_4$, $(C_7H_{15}NH_3)_2PbI_4$, $(C_4H_9NH_3)_2Pb_{(1-a)}Li_aBr_{(4+\delta)}$ (0<a≤0.7, −0.7≤δ<0), $(C_4H_9NH_3)_2Pb_{(1-a)}Na_aBr_{(4+\delta)}$ (0<a≤0.7, −0.7≤δ<0), $(C_4H_9NH_3)_2Pb_{(1-a)}Rb_aBr_{(4+\delta)}$ (0<a≤0.7, −0.7≤δ<0),
$(C_7H_{15}NH_3)_2Pb_{(1-a)}Na_aBr_{(4+\delta)}$ (0<a≤0.7, −0.7≤δ<0), $(C_7H_{15}NH_3)_2Pb_{(1-a)}Li_aBr_{(4+\delta)}$ (0<a≤0.7, −0.7≤δ<0), $(C_7H_{15}NH_3)_2Pb_{(1-a)}Rb_aBr_{(4+\delta)}$ (0<a≤0.7, −0.7≤δ<0),
$(C_4H_9NH_3)_2Pb_{(1-a)}Na_aBr_{(4+\delta-y)}I_y$ (0<a≤0.7, −0.7≤δ<0, 0<y<4), $(C_4H_9NH_3)_2Pb_{(1-a)}Li_aBr_{(4+\delta-y)}I_y$ (0<a≤0.7, −0.7≤δ<0, 0<y<4), $(C_4H_9NH_3)_2Pb_{(1-a)}Rb_aBr_{(4+\delta-y)}I_y$ (0<a≤0.7, −0.7≤δ<0, 0<y<4),
$(C_4H_9NH_3)_2Pb_{(1-a)}Na_aBr_{(4+\delta-y)}Cl_y$ (0<a≤0.7, −0.7≤δ<0, 0<y<4), $(C_4H_9NH_3)_2Pb_{(1-a)}Li_aBr_{(4+\delta-y)}Cl_y$ (0<a≤0.7, −0.7≤δ<0, 0<y<4), $(C_4H_9NH_3)_2Pb_{(1-a)}Rb_aBr_{(4+\delta-y)}Cl_y$ (0<a≤0.7, −0.7≤δ<0, 0<y<4),
$(C_4H_9NH_3)_2PbBr_4$, $(C_7H_{15}NH_3)_2PbBr_4$,
$(C_4H_9NH_3)_2PbBr_{(4-y)}Cl_y$ (0<y<4), $(C_4H_9NH_3)_2PbBr_{(4-y)}I_y$ (0<y<4),
$(C_4H_9NH_3)_2Pb_{(1-a)}Zn_aBr_4$ (0<a≤0.7), $(C_4H_9NH_3)_2Pb_{(1-a)}Mg_aBr_4$ (0<a≤0.7), $(C_4H_9NH_3)_2Pb_{(1-a)}CO_aBr_4$ (0<a≤0.7), $(C_4H_9NH_3)_2Pb_{(1-a)}Mn_aBr_4$ (0<a≤0.7), $(C_7H_{15}NH_3)_2Pb_{(1-a)}Zn_aBr_4$ (0<a≤0.7), $(C_7H_{15}NH_3)_2Pb_{(1-a)}Mg_aBr_4$ (0<a≤0.7), $(C_7H_{15}NH_3)_2Pb_{(1-a)}Co_aBr_4$ (0<a≤0.7), $(C_7H_{15}NH_3)_2Pb_{(1-a)}Mn_aBr_4$ (0<a≤0.7),
$(C_4H_9NH_3)_2Pb_{(1-a)}Zn_aBr_{(4-y)}I_y$ (0<a≤0.7, 0<y<4),
$(C_4H_9NH_3)_2Pb_{(1-a)}Mg_aBr_{(4-y)}I_y$ (0<a≤0.7, 0<y<4),
$(C_4H_9NH_3)_2Pb_{(1-a)}Co_aBr_{(4-y)}I_y$ (0<a≤0.7, 0<y<4),
$(C_4H_9NH_3)_2Pb_{(1-a)}Mn_aBr_{(4-y)}I_y$ (0<a≤0.7, 0<y<4),
$(C_4H_9NH_3)_2Pb_{(1-a)}Zn_aBr_{(4-y)}Cl_y$ (0<a≤0.7, 0<y<4),
$(C_4H_9NH_3)_2Pb_{(1-a)}Mg_aBr_{(4-y)}Cl_y$ (0<a≤0.7, 0<y<4),
$(C_4H_9NH_3)_2Pb_{(1-a)}Co_aBr_{(4-y)}Cl_y$ (0<a≤0.7, 0<y<4),
$(C_4H_9NH_3)_2Pb_{(1-a)}Mn_aBr_{(4-y)}Cl_y$ (0<a≤0.7, 0<y<4).

The semiconductor particle (A) may be a ligand-containing semiconductor particle including an organic ligand coordinated to a semiconductor particle. The organic ligand coordinated to a semiconductor particle can be, for example, an organic compound having a polar group exhibiting the coordination ability to the semiconductor particle. The organic ligand in the ligand-containing semiconductor particle may be an organic ligand added in terms of limitations on synthesis of the ligand-containing semiconductor particle, or for the purpose of stabilization. For example, a ligand-containing semiconductor particle disclosed in Japanese Translation of PCT International Application Publication No. 2015-529698 includes hexanoic acid as an organic ligand from the viewpoint of control of the particle size, in which the organic ligand is replaced with DDSA (dodecenyl succinic acid) for the purpose of stabilization after synthesis.

The organic ligand can be, for example, coordinated to the surface of the semiconductor particle.

The organic ligand coordinated to the semiconductor particle may correspond to one ligand or two or more ligands. In a case where the organic ligand is an organic compound having a polar group, the organic ligand is usually coordinated to the semiconductor particle via the polar group. The coordination of the organic ligand is confirmed by uniform dispersion of the semiconductor particle in a dispersion medium suitable for the organic ligand.

The polar group is preferably, for example, at least one group selected from the group consisting of a thiol group (—SH), a carboxy group (—COOH) and an amino group (—NH$_2$). The polar group selected from the above group can have the advantage of enhancing coordinating properties to the semiconductor particle. High coordinating properties can contribute to an improvement in variation in color of a cured film and/or an improvement in patterning ability of the photosensitive composition. In particular, the polar group is more preferably at least one group selected from the group consisting of a thiol group and a carboxy group from the viewpoint that a cured film (for example, wavelength conversion film) more excellent in emission characteristics is obtained. The organic ligand can have one or more of such polar groups.

The molecular weight of the organic ligand coordinated to the semiconductor particle is not particularly limited, and is, for example, 50 or more and 500 or less, preferably 80 or more and 400 or less. When the molecular weight of the organic ligand is in the above range, the ligand-containing semiconductor particle can be prepared at excellent reproducibility.

The organic ligand can be, for example, an organic compound represented by the following formula:

Y—Z wherein Y is the polar group and Z is a monovalent hydrocarbon group optionally containing a hetero atom (N, O, S, halogen atom, or the like). The hydrocarbon group may have one or more unsaturated bonds such as a carbon-carbon double bond. The hydrocarbon group may have a straight, branched or cyclic structure. The number of carbon atoms in the hydrocarbon group is, for example, 1 or more and 40 or less, and may be 1 or more and 30 or less. A methylene group contained in the hydrocarbon group may be substituted with, for example, —O—, —S—, —C(=O)—, —C(=O)—O—, —O—C(=O)—, —C(=O)—NH—, or —NH—. The hydrocarbon group usually has no hetero atom in many cases, in terms of simplicity of preparation of the ligand-containing semiconductor particle.

The organic ligand represented by Y—Z is preferably a saturated fatty acid having 5 or more and 12 or less carbon atoms or an unsaturated fatty acid having 5 or more and 12 or less carbon atoms.

The group Z may include a polar group. Specific examples of the polar group are those cited from the above description with respect to the polar group Y. The group Z usually has no polar group in terms of simplicity of preparation of the ligand-containing semiconductor particle.

Specific examples of the organic ligand having a carboxy group as the polar group Y can include a saturated or unsaturated fatty acid, in addition to formic acid, acetic acid and propionic acid. Examples of the saturated or unsaturated fatty acid include saturated fatty acids such as butyric acid, pentanoic acid, caproic acid, caprylic acid, capric acid, lauric acid, myristic acid, pentadecylic acid, palmitic acid, margaric acid, stearic acid, arachidic acid, behenic acid and lignoceric acid; monovalent unsaturated fatty acids such as myristoleic acid, palmitoleic acid, oleic acid, icosenoic acid, erucic acid and nervonic acid; and polyvalent unsaturated fatty acids such as linoleic acid, α-linolenic acid, γ-linolenic acid, stearidonic acid, dihomo-γ-linolenic acid, arachidonic acid, eicosatetraenoic acid, docosadienoic acid and adrenic acid (docosatetraenoic acid).

Specific examples of the organic ligand having a thiol group or an amino group as the polar group Y include the organic ligand having a carboxy group as the polar group Y, exemplified above, in which the carboxy group is replaced with a thiol group or an amino group.

The content of the semiconductor particle (A) is preferably 10% by mass or more, more preferably 16% by mass or more, further preferably 17% by mass or more, still further preferably 18% by mass or more, particularly preferably 20% by mass or more, most preferably 25% by mass or more, and preferably 45% by mass or less, more preferably 40% by mass or less, further preferably 35% by mass or less based on the total amount of the photosensitive composition. When the content of the semiconductor particle (A) is in the above range, a cured film (for example, wavelength conversion film) can achieve a sufficient light conversion efficiency.

<Light Scattering Agent (B)>

The photosensitive composition of the present invention preferably includes a light scattering agent (B). The light scattering agent (B), when included, thus allows for enhancements in scattering properties of light from a light source, with which a wavelength conversion film formed from the photosensitive composition is irradiated. Examples of the light scattering agent (B) can include a metal or metal oxide particle, and a glass particle. Examples of the metal oxide include $TiO_2$, $SiO_2$, $BaTiO_3$ and ZnO.

The median size on a volume basis of the light scattering agent (B) is, for example, 0.03 μm or more, preferably 0.10 μm or more, more preferably 0.15 μm or more, further preferably 0.20 μm or more, and is, for example, 20 μm or less, preferably 5 μm or less, further preferably 1 μm or less.

The content of the light scattering agent (B) is usually 0.001% by mass or more and 50% by mass or less, and is preferably 0.01% by mass or more, more preferably 0.1% by mass or more, further preferably 1% by mass or more, and preferably 30% by mass or less, more preferably 15% by mass or less, further preferably 10% by mass or less, based on the total amount of the photosensitive composition.

<Photopolymerizable Compound (C)>

Examples of the photopolymerizable compound (C) include a photoradical polymerizable compound to be cured due to a radical polymerization reaction by irradiation with light, and a photocationic polymerizable compound to be cured due to a cationic polymerization reaction by irradiation with light. The photopolymerizable compound (C) is preferably a photoradical polymerizable compound. The weight average molecular weight of the photopolymerizable compound (C) is preferably 3000 or less.

Examples of the photoradical polymerizable compound include a compound having a polymerizable ethylenically unsaturated bond, and in particular, a (meth)acrylate compound is preferable. Examples of the (meth)acrylate compound include a monofunctional (meth)acrylate monomer having one (meth)acryloyloxy group in its molecule, a bifunctional (meth)acrylate monomer having two (meth)acryloyloxy groups in its molecule, and a polyfunctional (meth)acrylate monomer having three or more (meth)acryloyloxy groups in its molecule.

Examples of the monofunctional (meth)acrylate monomer include methyl (meth)acrylate, ethyl (meth)acrylate, propyl (meth)acrylate, butyl (meth)acrylate, amyl (meth)acrylate, 2-ethylhexyl (meth)acrylate, octyl (meth)acrylate, nonyl (meth)acrylate, dodecyl (meth)acrylate, hexadecyl (meth)acrylate, octadecyl (meth)acrylate, cyclohexyl (meth)acrylate, methoxyethyl (meth)acrylate, butoxyethyl (meth)acrylate, phenoxyethyl (meth)acrylate, nonylphenoxyethyl (meth)acrylate, glycidyl (meth)acrylate, dimethylaminoethyl (meth)acrylate, diethylaminoethyl (meth)acrylate, isobornyl (meth)acrylate, dicyclopentanyl (meth)acrylate, dicyclopentenyl (meth)acrylate, dicyclopentenyloxyethyl (meth)acrylate, 2-hydroxy-3-phenoxypropyl (meth)acrylate, tetrahydrofurfuryl (meth)acrylate, 2-hydroxyethyl (meth)acrylate, benzyl (meth)acrylate, phenyl (meth)acrylate, mono(2-acryloyloxyethyl) succinate, N-[2-(acryloyloxy)ethyl]phthalimide, N-[2-(acryloyloxy)ethyl]tetrahydrophthalimide, 2-(2-vinyloxyethoxy)ethyl (meth)acrylate, and ω-carboxy-polycaprolactone monoacrylate.

Examples of the bifunctional (meth)acrylate monomer include 1,3-butylene glycol di(meth)acrylate, 1,4-butanediol di(meth)acrylate, 1,5-pentanediol di(meth)acrylate, 3-methyl-1,5-pentanediol di(meth)acrylate, 1,6-hexanediol di(meth)acrylate, neopentyl glycol di(meth)acrylate, 1,8-octanediol di(meth)acrylate, 1,9-nonanediol di(meth)acrylate, tricyclodecane dimethanol di(meth)acrylate, ethylene glycol di(meth)acrylate, polyethylene glycol di(meth)acrylate, propylene glycol di(meth)acrylate, dipropylene glycol di(meth)acrylate, tripropylene glycol di(meth)acrylate, polypropylene glycol di(meth)acrylate, neopentyl glycol hydroxypivalic acid ester di(meth)acrylate, a di(meth)acrylate in which two hydroxyl groups of tris(2-hydroxyethyl) isocyanurate are each substituted with a (meth)acryloyloxy group, a di(meth)acrylate in which two hydroxyl groups of a diol obtained by adding 4 mol or more of ethylene oxide or propylene oxide to 1 mol of neopentyl glycol are each substituted with a (meth)acryloyloxy group, a di(meth) acrylate in which two hydroxyl groups of a diol obtained by adding 2 mol of ethylene oxide or propylene oxide to 1 mol of bisphenol A are each substituted with a (meth)acryloyloxy group, a di(meth)acrylate in which two hydroxyl groups of a triol obtained by adding 3 mol or more of ethylene oxide or propylene oxide to 1 mol of trimethylolpropane are each substituted with a (meth)acryloyloxy group, and a di(meth) acrylate in which two hydroxyl groups of a diol obtained by adding 4 mol or more of ethylene oxide or propylene oxide to 1 mol of bisphenol A are each substituted with a (meth) acryloyloxy group.

Examples of the polyfunctional (meth)acrylate monomer include glycerin tri(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa(meth)acrylate, tripentaerythritol hepta(meth)acrylate, tetrapentaerythritol deca(meth)acrylate, tetrapentaerythritol nona(meth)acrylate, tris(2-(meth)acryloyloxyethyl)isocyanurate, ethylene glycol-modified pentaerythritol tetra(meth)acrylate, ethylene glycol-modified dipentaerythritol hexa(meth)acrylate, propylene glycol-modified pentaerythritol tetra(meth)acrylate, propylene glycol-modified dipentaerythritol hexa(meth)acrylate, caprolactone-modified pentaerythritol tetra(meth)acrylate, caprolactone-modified dipentaerythritol hexa(meth)acrylate, pentaerythritol triacrylate succinic acid monoester, and dipentaerythritol pentaacrylate succinic acid monoester.

Examples of the photocationic polymerizable compound can include a compound having at least one oxetane ring (4-membered ether) in its molecule (hereinafter, sometimes simply referred to as "oxetane compound"), a compound having at least one oxirane ring (3-membered ether) in its molecule (hereinafter, sometimes simply referred to as "epoxy compound"), and a vinyl ether compound.

Examples of the oxetane compound include 3-ethyl-3-hydroxymethyloxetane, 1,4-bis[(3-ethyl-3-oxetanyl) methoxymethyl]benzene, 3-ethyl-3-(phenoxymethyl)oxetane, di[(3-ethyl-3-oxetanyl)methyl]ether, 3-ethyl-3-(2-ethylhexyloxymethyl)oxetane, and phenol novolac oxetane. Such an oxetane compound can be easily available as a commercially available product, and examples of such a commercially available product include trade names "Arone Oxetane (registered trademark) OXT-101", "Arone Oxetane (registered trademark) OXT-121", "Arone Oxetane (registered trademark) OXT-211", "Arone Oxetane (registered trademark) OXT-221", and "Arone Oxetane (registered trademark) OXT-212" which are all sold by Toagosei Co., Ltd.

Examples of the epoxy compound include an aromatic epoxy compound, glycidyl ether of a polyol having an alicyclic ring, an aliphatic epoxy compound, and an alicyclic epoxy compound.

Examples of the aromatic epoxy compound include bisphenol-type epoxy resins such as diglycidyl ether of bisphenol A, diglycidyl ether of bisphenol F and diglycidyl ether of bisphenol S; novolac-type epoxy resins such as a phenol novolac epoxy resin, a cresol novolac epoxy resin and a hydroxybenzaldehyde phenol novolac epoxy resin; and polyfunctional epoxy resins such as glycidyl ether of tetrahydroxyphenylmethane, glycidyl ether of tetrahydroxybenzophenone, and epoxidized polyvinyl phenol.

Examples of the glycidyl ether of a polyol having an alicyclic ring include a glycidyl etherized product of a nuclear hydrogenated polyhydroxy compound obtained by a selective hydrogenation reaction of an aromatic ring of an aromatic polyol under pressure in the presence of a catalyst. Examples of the aromatic polyol include bisphenol-type compounds such as bisphenol A, bisphenol F and bisphenol S; novolac-type resins such as a phenol novolac resin, a cresol novolac resin and a hydroxybenzaldehyde phenol novolac resin; and polyfunctional compounds such as tetrahydroxydiphenylmethane, tetrahydroxybenzophenone and polyvinyl phenol. An alicyclic polyol obtained by a hydrogenation reaction of an aromatic ring of the aromatic polyol can be allowed to react with epichlorohydrin to thereby provide glycidyl ether. Preferable examples of such glycidyl ether of a polyol having an alicyclic ring include diglycidyl ether of hydrogenated bisphenol A.

Examples of the aliphatic epoxy compound include polyglycidyl ether of an aliphatic polyhydric alcohol or an alkylene oxide adduct thereof. Specific examples include diglycidyl ether of 1,4-butanediol; diglycidyl ether of 1,6-hexanediol; triglycidyl ether of glycerin; triglycidyl ether of trimethylolpropane; diglycidyl ether of polyethylene glycol; diglycidyl ether of propylene glycol; diglycidyl ether of neopentyl glycol; and polyglycidyl ether of a polyether polyol obtained by adding one or more alkylene oxides (ethylene oxide and/or propylene oxide) to an aliphatic polyhydric alcohol such as ethylene glycol, propylene glycol or glycerin.

The alicyclic epoxy compound is a compound having, in its molecule, at least one structure in which an oxirane ring is formed together with a carbon atom of an alicyclic ring, and "Celloxide" series and "Cyclomer" (these are manufactured by Daicel Corporation), and "Cyracure UVR" series (manufactured by Dow Chemical Company) can be used.

Examples of the vinyl ether compound include 2-hydroxyethyl vinyl ether, triethylene glycol vinyl monoether, tetraethylene glycol divinyl ether, and trimethylolpropane trivinyl ether.

The photopolymerizable compound (C) preferably includes a (meth)acrylate compound (C1) having a molecular weight of 180 or less (hereinafter, sometimes simply referred to as "compound (C1)"). The compound (C1) is not particularly limited as long as it is a compound having a molecular weight of 180 or less and having a (meth)acryloyloxy group. The photosensitive composition, which includes the compound (C1), can be thus reduced in viscosity and more enhanced in coatability.

Examples of the compound (C1) include a monofunctional (meth)acrylate monomer having one (meth)acryloyloxy group in its molecule and having a molecular weight of 180 or less, and a bifunctional (meth)acrylate monomer having two (meth)acryloyloxy groups in its molecule and having a molecular weight of 180 or less, and a monofunctional (meth)acrylate monomer having a molecular weight of 180 or less is preferable from the viewpoint of a reduction in viscosity.

Examples of the monofunctional (meth)acrylate monomer having a molecular weight of 180 or less include, among the compounds described with respect to the monofunctional (meth)acrylate monomer, the compound having a molecular weight of 180 or less. The monofunctional (meth)acrylate monomer having a molecular weight of 180 or less is preferably at least one compound selected from a (meth)acrylic acid alkyl ester having a molecular weight of 180 or less, a (meth)acrylic acid aryl ester having a molecular weight of 180 or less, and a (meth)acrylic acid aralkyl ester having a molecular weight of 180 or less.

Examples of the (meth)acrylic acid alkyl ester include methyl (meth)acrylate, ethyl (meth)acrylate, propyl (meth)acrylate, butyl (meth)acrylate, amyl (meth)acrylate, and hexyl (meth)acrylate.

Examples of the (meth)acrylic acid aryl ester include phenyl (meth)acrylate.

Examples of the (meth)acrylic acid aralkyl ester include benzyl (meth)acrylate.

A hydrogen atom in the alkyl group in the (meth)acrylic acid alkyl ester, a hydrogen atom in the aryl group in the (meth)acrylic acid aryl ester, and a hydrogen atom in the aralkyl group in the (meth)acrylic acid aralkyl ester may be each substituted with a substituent such as a hydroxy group, an amino group, or an alkoxy group (preferably $C_{1-4}$ alkoxy group) as long as the molecular weight of the compound is not more than 180, and preferably are not substituted.

The compound (C1) is preferably a (meth)acrylic acid alkyl ester having a molecular weight of 180 or less, more preferably a (meth)acrylic acid $C_{1-4}$ alkyl ester, particularly preferably ethyl (meth)acrylate.

The molecular weight of the compound (C1) is preferably 160 or less, more preferably 150 or less, further preferably 140 or less, and is, for example, 86 or more.

The viscosity at 25° C. of the compound (C1) is preferably 2.5 cP or less, more preferably 2.0 cP or less, further preferably 1.2 cP or less, particularly preferably 1.0 cP or less, most preferably 0.8 cP or less, and is, for example, 0.1 cP or more.

In a case where the compound (C1) is included in the photopolymerizable compound (C), the content thereof is preferably 5% by mass or more, more preferably 15% by mass or more, further preferably 25% by mass or more, particularly preferably 30% by mass or more, and preferably 75% by mass or less, more preferably 60% by mass or less, further preferably 55% by mass or less, particularly preferably 50% by mass or less based on the total amount of the photopolymerizable compound (C).

In a case where the compound (C1) is included in the photopolymerizable compound (C), the content thereof is preferably 5% by mass or more, more preferably 8% by mass or more, further preferably 10% by mass or more, particularly preferably 13% by mass or more, most preferably 17% by mass or more, and preferably 50% by mass or less, more preferably 40% by mass or less, further preferably 30% by mass or less based on the total amount of the photosensitive composition.

The photopolymerizable compound (C) preferably includes a compound (C2) having a vinyl ether group and a (meth)acryloyl group (preferably, (meth)acryloyloxy group) in the same molecule (hereinafter, sometimes simply referred to as "compound (C2)"). The photosensitive composition, which includes the compound (C2), thus can allow for suppression of semiconductor particle aggregation and an enhancement in semiconductor particle dispersibility, resulting in a more enhancement in light conversion efficiency of a cured film obtained from the photosensitive composition. The photosensitive composition, which includes the compound (C2), thus can be reduced in viscosity and more enhanced in coatability.

The number of vinyl ether groups in the compound (C2) is preferably 1 or more and 4 or less, more preferably 1 or more and 2 or less, particularly preferably 1.

The number of (meth)acryloyl groups in the compound (C2) is preferably 1 or more and 4 or less, more preferably 1 or more and 2 or less, particularly preferably 1.

Examples of the compound (C2) include 2-vinyloxyethyl (meth)acrylate, 3-vinyloxypropyl (meth)acrylate, 2-vinyloxypropyl (meth)acrylate, 1-vinyloxypropyl (meth)acrylate, 1-methyl-2-vinyloxyethyl (meth)acrylate, 4-vinyloxybutyl (meth)acrylate, 3-vinyloxybutyl (meth)acrylate, 2-vinyloxybutyl (meth)acrylate, 1-methyl-3-vinyloxypropyl (meth)acrylate, 2-methyl-3-vinyloxypropyl (meth)acrylate, 1-methyl-2-vinyloxypropyl (meth)acrylate, 1,1-dimethyl-2- vinyloxyethyl (meth)acrylate, 6-vinyloxyhexyl (meth)acrylate, 4-vinyloxycyclohexyl (meth)acrylate, (4-vinyloxymethylcyclohexyl)methyl (meth)acrylate, (3-vinyloxymethylcyclohexyl)methyl (meth)acrylate, (2-vinyloxymethylcyclohexyl)methyl (meth)acrylate, (4-vinyloxymethylphenyl)methyl (meth)acrylate, (3-vinyloxymethylphenyl)methyl (meth)acrylate, 2-vinyloxymethylphenylmethyl (meth)acrylate, 2-(2-vinyloxyisopropoxy)ethyl (meth)acrylate, 2-(2-vinyloxyethoxy) ethyl (meth)acrylate, 2-(2-vinyloxyethoxy)propyl (meth) acrylate, 2-(2-vinyloxyisopropoxy)propyl (meth)acrylate, 2-(2-vinyloxyethoxy)isopropyl (meth)acrylate, 2-(2-vinyloxyisopropoxy)isopropyl (meth)acrylate, 2-{2-(2-vinyloxyethoxy)ethoxy}ethyl (meth)acrylate, 2-{2-(2-vinyloxyisopropoxy)ethoxy}ethyl (meth)acrylate, 2-{2-(2-vinyloxyisopropoxy)isopropoxy}ethyl (meth)acrylate, 2-{2-(2-vinyloxyethoxy)ethoxy}propyl (meth)acrylate, 2-{2-(2-vinyloxyethoxy)isopropoxy}propyl (meth)acrylate, 2-{2-(2-vinyloxyisopropoxy)ethoxy}propyl (meth)acrylate, 2-{2-(2-vinyloxyisopropoxy)isopropoxy}propyl (meth)acrylate, 2-{2-(2-vinyloxyethoxy)ethoxy}isopropyl (meth)acrylate, 2-{2-(2-vinyloxyethoxy)isopropoxy}isopropyl (meth)acrylate, 2-{2-(2-vinyloxyisopropoxy)ethoxy}isopropyl (meth)acrylate, 2-{2-(2-vinyloxyisopropoxy) isopropoxy}isopropyl (meth)acrylate, 2-[2-{2-(2-vinyloxyethoxy)ethoxy}ethoxy]ethyl (meth)acrylate, 2-[2-{2-(2-vinyloxyisopropoxy)ethoxy}ethoxy]ethyl (meth) acrylate, and 2-(2-[2-{2-(2-vinyloxyethoxy)ethoxy}ethoxy]ethoxy)ethyl (meth)acrylate.

The compound (C2) is preferably vinyloxy $C_{1-6}$ alkyl (meth)acrylate or (vinyloxy $C_{1-4}$ alkoxy)$C_{1-4}$ alkyl (meth)acrylate, more preferably (vinyloxy $C_{1-4}$ alkoxy)$C_{1-4}$ alkyl (meth)acrylate, particularly preferably 2-(2-vinyloxyethoxy) ethyl (meth)acrylate.

In a case where the compound (C2) is included in the photopolymerizable compound (C), the content thereof is preferably 5% by mass or more, more preferably 10% by mass or more, further preferably 20% by mass or more, and preferably 85% by mass or less, more preferably 75% by mass or less, further preferably 60% by mass or less, particularly preferably 50% by mass or less, most preferably 40% by mass or less based on the total amount of the photopolymerizable compound (C).

In a case where the compound (C2) is included in the photopolymerizable compound (C), the content thereof is preferably 3% by mass or more, more preferably 5% by mass or more, further preferably 8% by mass or more, and preferably 50% by mass or less, more preferably 35% by mass or less, further preferably 25% by mass or less based on the total amount of the photosensitive composition.

The photopolymerizable compound (C) preferably includes a compound (C3) having a carboxy group and three or more functional groups other than a carboxy group in the same molecule (hereinafter, sometimes simply referred to as "compound (C3)"). The photosensitive composition, which includes the compound (C3), thus can allow for suppression of semiconductor particle aggregation and an enhancement in semiconductor particle dispersibility, resulting in a more enhancement in light conversion efficiency of a cured film obtained from the photosensitive composition. The photosensitive composition, which includes the compound (C3), thus is enhanced in curability. Furthermore, the photosensitive composition, which includes the compound (C3), thus is more enhanced in heat resistance, and in particular, the photosensitive composition, which includes the compound (C3) and 8% by mass or more of a stabilizer (E) based on the total amount of the photosensitive composition, thus is still more enhanced in heat resistance.

Examples of the functional group include a (meth)acryloyloxy group, an epoxy group and an oxetane group, and in particular, a (meth)acryloyloxy group is preferable. The number of functional groups in one molecule of the compound (C3) is preferably 3 to 5, more preferably 3. The number of carboxy groups in one molecule of the compound (C3) is preferably 1.

Examples of the compound (C3) include a compound obtained by esterification of a compound having three or more functional groups (in particular, (meth)acryloyloxy groups) and a hydroxy group, such as pentaerythritol tri (meth)acrylate or dipentaerythritol penta(meth)acrylate, and dicarboxylic acid. Specific examples include a compound obtained by monoesterification of pentaerythritol tri(meth) acrylate and succinic acid, a compound obtained by monoesterification of dipentaerythritol penta(meth)acrylate and succinic acid, a compound obtained by monoesterification of pentaerythritol tri(meth)acrylate and maleic acid, and a compound obtained by monoesterification of dipentaerythritol penta(meth)acrylate and maleic acid. In particular, a compound obtained by monoesterification of pentaerythritol tri(meth)acrylate and succinic acid is preferable.

In a case where the compound (C3) is included in the photopolymerizable compound (C), the content thereof is preferably 5% by mass or more, more preferably 10% by mass or more, further preferably 20% by mass or more, and preferably 70% by mass or less, more preferably 60% by mass or less, further preferably 50% by mass or less, particularly preferably 40% by mass or less based on the total amount of the photopolymerizable compound (C).

In a case where the compound (C3) is included in the photopolymerizable compound (C), the content thereof is preferably 20 parts by mass or more, more preferably 25 parts by mass or more, further preferably 30 parts by mass or more, particularly preferably 40 parts by mass or more, and preferably 110 parts by mass or less, more preferably 100 parts by mass or less, further preferably 85 parts by mass or less, particularly preferably 70 parts by mass or less based on 100 parts by mass of the semiconductor particle (A).

The photopolymerizable compound (C) preferably includes at least one compound selected from the compound (C1), the compound (C2) and the compound (C3), more preferably includes at least the compound (C3), further preferably includes a combination of the compound (C3) and the compound (C2), or a combination of the compound (C3) and the compound (C1), particularly preferably includes all the compound (C1), the compound (C2) and the compound (C3).

When the photopolymerizable compound (C) includes the compound (C1) and the compound (C3), the content of the compound (C1) based on 1 part by mass of the compound (C3) is preferably 0.5 parts by mass or more, more preferably 0.8 parts by mass or more, further preferably 1.0 part by mass or more, and preferably 5 parts by mass or less, more preferably 4 parts by mass or less, further preferably 3 parts by mass or less.

When the photopolymerizable compound (C) includes the compound (C2) and the compound (C3), the content of the compound (C2) based on 1 part by mass of the compound (C3) is preferably 0.3 parts by mass or more, more preferably 0.5 parts by mass or more, further preferably 0.8 parts by mass or more, and preferably 5 parts by mass or less, more preferably 3 parts by mass or less, further preferably 1.5 parts by mass or less.

When the photopolymerizable compound (C) includes the compound (C1), the compound (C2) and the compound (C3), the total amount of the compound (C1) and the compound (C2) based on 1 part by mass of the compound (C3) is preferably 0.5 parts by mass or more, more preferably 1.0 part by mass or more, further preferably 1.5 parts by mass or more, and preferably 5 parts by mass or less, more preferably 4 parts by mass or less, further preferably 3 parts by mass or less.

The total amount of the compound (C1), the compound (C2) and the compound (C3) is preferably 30% by mass or more, more preferably 50% by mass or more, further preferably 70% by mass or more, particularly preferably 90% by mass or more, or may be 100% by mass, based on the total amount of the photopolymerizable compound (C).

In particular, when the photopolymerizable compound (C) includes the compound (C1) and the compound (C3), the total amount of the compound (C1) and the compound (C3) is preferably 30% by mass or more, more preferably 40% by mass or more, further preferably 60% by mass or more, particularly preferably 70% by mass or more, or may be 100% by mass, based on the total amount of the photopolymerizable compound (C).

When the photopolymerizable compound (C) includes the compound (C2) and the compound (C3), the total amount of the compound (C2) and the compound (C3) is preferably 30% by mass or more, more preferably 40% by mass or more, further preferably 50% by mass or more, particularly preferably 60% by mass or more, or may be 100% by mass, and is preferably 90% by mass or less, more preferably 80% by mass or less, based on the total amount of the photopolymerizable compound (C).

The content of the photopolymerizable compound (C) is preferably 10% by mass or more, more preferably 20% by mass or more, further preferably 30% by mass or more, particularly preferably 40% by mass or more, and preferably 80% by mass or less, more preferably 70% by mass or less, further preferably 65% by mass or less, particularly preferably 60% by mass or less based on the total amount of the photosensitive composition.

<Photopolymerization Initiator (D)>

The photopolymerization initiator (D) is not particularly limited as long as it is a compound which can generate an active radical, an acid, or the like by action of light to thereby initiate polymerization, and a known photopolymerization initiator can be used.

Examples of the photopolymerization initiator (D) include an oxime-based compound such as an O-acyloxime compound, an alkylphenone compound, a biimidazole compound, a triazine compound, and an acylphosphine oxide compound.

The O-acyloxime compound is a compound having a structure represented by the following formula (d). Hereinafter, * represents a bonding hand.

[Formula 1]

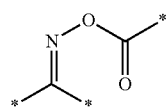
(d)

Examples of the O-acyloxime compound include N-benzoyloxy-1-(4-phenylsulfanylphenyl)butan-1-one-2-imine, N-benzoyloxy-1-(4-phenylsulfanylphenyl)octan-1-one-2-imine, N-benzoyloxy-1-(4-phenylsulfanylphenyl)-3-cyclopentylpropan-1-one-2-imine, N-acetoxy-1-[9-ethyl-6-(2-methylbenzoyl)-9H-carbazol-3-yl]ethan-1-imine, N-acetoxy-1-[9-ethyl-6-{2-methyl-4-(3,3-dimethyl-2,4-dioxacyclopentanylmethyloxy)benzoyl}-9H-carbazol-3-yl]ethan-1-imine, N-acetoxy-1-[9-ethyl-6-(2-methylbenzoyl)-9H-carbazol-3-yl]-3-cyclopentylpropan-1-imine, N-benzoyloxy-1-[9-ethyl-6-(2-methylbenzoyl)-9H-carbazol-3-yl]-3-cyclopentylpropan-1-one-2-imine, N-acetyloxy-1-[4-(2-hydroxyethyloxy)phenylsulfanylphenyl]propan-1-one-2-imine, and N-acetyloxy-1-[4-(1-methyl-2-methoxyethoxy)-2-methylphenyl]-1-(9-ethyl-6-nitro-9H-carbazol-3-yl)methan-1-imine. Any commercially available product such as Irgacure (registered trademark) OXE01, Irgacure OXE02 and Irgacure OXE03 (these are manufactured by BASF SE), and N-1919, NCI-930 and NCI-831 (these are manufactured by Adeka Corporation) may be used. Such an O-acyloxime compound has the advantage of being capable of enhancing lithography performance.

The alkylphenone compound is a compound having a partial structure represented by the following formula (d4) or a partial structure represented by the following formula (d5). Such a partial structure optionally has a substituent in a benzene ring.

[Formula 2]

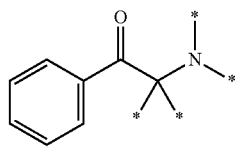
(d4)

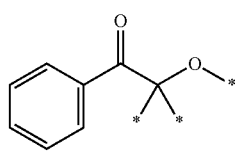
(d5)

Examples of the compound having the structure represented by the formula (d4) include 2-methyl-2-morpholino-1-(4-methylsulfanylphenyl)propan-1-one, 2-dimethylamino-1-(4-morpholinophenyl)-2-benzylbutan-1-one, and 2-(dimethylamino)-2-[(4-methylphenyl)methyl]-1-[4-(4-morpholinyl)phenyl]butan-1-one. Any commercially available product such as OMNIRAD (registered trademark) 369, OMNIRAD 907 and OMNIRAD 379 (these are manufactured by IGM Resins B.V.) may be used.

Examples of the compound having the structure represented by the formula (d5) include 2-hydroxy-2-methyl-1-phenylpropan-1-one, 2-hydroxy-2-methyl-1-[4-(2-hydroxyethoxy)phenyl]propan-1-one, 1-hydroxycyclohexylphenyl ketone, an oligomer of 2-hydroxy-2-methyl-1-(4-isopropenylphenyl)propan-1-one, α,α-diethoxyacetophenone, and benzyl dimethyl ketal.

The alkylphenone compound is preferably the compound having the structure represented by the formula (d4) in terms of sensitivity.

Examples of the biimidazole compound include 2,2'-bis(2-chlorophenyl)-4,4',5,5'-tetraphenylbiimidazole, 2,2'-bis(2,3-dichlorophenyl)-4,4',5,5'-tetraphenylbiimidazole (see, for example, Japanese Patent Laid-Open No. 6-75372 and Japanese Patent Laid-Open No. 6-75373), 2,2'-bis(2-chlorophenyl)-4,4',5,5'-tetraphenylbiimidazole, 2,2'-bis(2-chlorophenyl)-4,4',5,5'-tetra(alkoxyphenyl)biimidazole, 2,2'-bis (2-chlorophenyl)-4,4',5,5'-tetra(dialkoxyphenyl) biimidazole, 2,2'-bis(2-chlorophenyl)-4,4',5,5'-tetra (trialkoxyphenyl)biimidazole (see, for example, Japanese Patent Publication No. 48-38403 and Japanese Patent Laid-Open No. 62-174204), and an imidazole compound in which phenyl groups at the 4,4',5,5'-positions are each substituted with a carboalkoxy group (see, for example, Japanese Patent Laid-Open No. 7-10913). In particular, a compound represented by the following formula or mixture thereof is preferable.

[Formula 3]

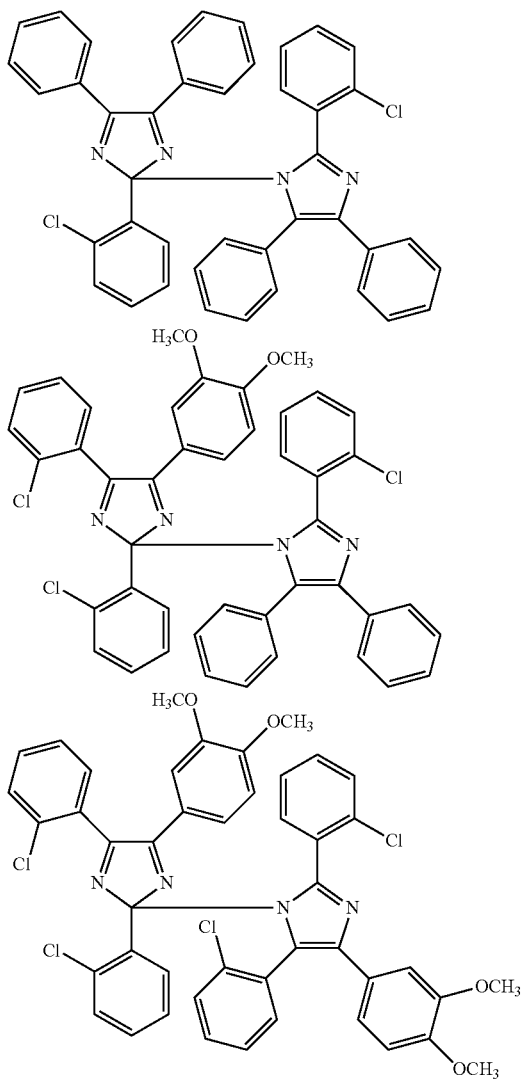

Examples of the triazine compound include 2,4-bis (trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis (trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl) ethenyl]-1,3,5-triazine, 2,4-bis(trichloromethyl)-6-[2-(4-diethylamino-2-methylphenyl)ethenyl]-1,3,5-triazine, and 2,4-bis (trichloromethyl)-6-[2-(3,4-dimethoxyphenyl)ethenyl]-1,3,5-triazine.

Examples of the acylphosphine oxide compound include 2,4,6-trimethylbenzoyldiphenylphosphine oxide.

Examples of the photopolymerization initiator (D) include benzoin compounds such as benzoin, benzoin methyl ether, benzoin ethyl ether, benzoin isopropyl ether and benzoin isobutyl ether; benzophenone compounds such as benzophenone, o-methyl benzoylbenzoate, 4-phenylbenzophenone, 4-benzoyl-4'-methyldiphenylsulfide, 3,3',4,4'-tetra(tert-butylperoxycarbonyl)benzophenone and 2,4,6-trimethylbenzophenone; quinone compounds such as 9,10-phenanthrenequinone, 2-ethylanthraquinone and camphorquinone; 10-butyl-2-chloroacridone, benzil, methyl phenylglyoxylate, and titanocene compounds. Such an initiator is preferably used in combination with a polymerization initiation aid such as an amine compound, an alkoxyanthracene compound, a thioxanthone compound, and a carboxylic acid compound.

The photopolymerization initiator (D) is preferably a photopolymerization initiator including at least one selected from the group consisting of an alkylphenone compound, a triazine compound, an acylphosphine oxide compound, an O-acyloxime compound and a biimidazole compound, and is more preferably a photopolymerization initiator including an alkylphenone compound from the viewpoint of sensitivity.

The content of the photopolymerization initiator (D) is preferably 3% by mass or more, more preferably 4% by mass or more, and preferably 40% by mass or less, more preferably 30% by mass or less, or may be 20% by mass or less or may be 15% by mass or less, based on the total amount of the photosensitive composition.

The content of the photopolymerization initiator (D) is preferably 3 parts by mass or more, more preferably 8 parts by mass or more, and preferably 70 parts by mass or less, more preferably 55 parts by mass or less, further preferably 30 parts by mass or less, or may be 20 parts by mass or less, based on 100 parts by mass of the photopolymerizable compound (C). When the content of the photopolymerization initiator (D) is in the above range, the exposure time tends to be shortened by an increase in sensitivity and thus a cured film such as a wavelength conversion film tends to be enhanced in productivity.

The content of the photopolymerization initiator (D) is preferably 40 parts by mass or less, more preferably 30 parts by mass or less, further preferably 25 parts by mass or less, based on 100 parts by mass of the photopolymerizable compound (C). When the content of the photopolymerization initiator (D) is in the above range, a photosensitive composition more reduced in viscosity can be provided.

The content of the photopolymerization initiator (D) is also preferably, for example, 15 parts by mass or more and 40 parts by mass or less, more preferably 15 parts by mass or more and 30 parts by mass or less, further preferably 15 parts by mass or more and 25 parts by mass or less, based on 100 parts by mass of the photopolymerizable compound (C). When the content of the photopolymerization initiator (D) is in the above range, a photosensitive composition capable of providing a cured film more excellent in heat resistance can be provided.

<Stabilizer (E)>

The photosensitive composition of the present invention may further include a stabilizer (E). The stabilizer (E) is not particularly limited as long as it is a compound having a function of deactivating any degradation factor such as a carbon radical generated by action of heat, light or the like, a peroxy radical produced by oxidation of the carbon radical generated, and hydroperoxide produced from the peroxy radical, and examples thereof include an antioxidant and a light stabilizer.

The antioxidant is not particularly limited as long as it is an antioxidant industrially commonly used, and, for example, a phenol-based antioxidant, a phosphorus-based antioxidant and a sulfur-based antioxidant can be each used.

Examples of the phenol-based antioxidant include Irganox (registered trademark) 1010 (pentaerythritoltetrakis [3-(3,5-di-t-butyl-4-hydroxyphenyl)propionate], manufactured by BASF SE), Irganox 1076 (octadecyl-3-(3,5-di-t-butyl-4-hydroxyphenyl)propionate, manufactured by BASF SE), Irganox 1330 (3,3',3",5,5',5"-hexa-t-butyl-a,a',a"-(mesitylen-2,4,6-triyl)tri-p-cresol, manufactured by BASF SE), Irganox 3114 (1,3,5-tris(3,5-di-t-butyl-4-hydroxybenzyl)-1,3,5-triazine-2,4,6(1H,3H,5H)-trione, manufactured by BASF SE), Irganox 3790 (1,3,5-tris((4-t-butyl-3-hydroxy-2,6-xylyl)methyl)-1,3,5-triazine-2,4,6(1H,3H,5H)-trione, manufactured by BASF SE), Irganox 1035 (thiodiethylen-ebis[3-(3,5-di-tert-butyl-4-hydroxyphenyl)propionate], manufactured by BASF SE), Irganox 1135 (benzenepropanoic acid, 3,5-bis(1,1-dimethylethyl)-4-hydroxy, C7-C9 side chain alkyl ester, manufactured by BASF SE), Irganox 1520L (4,6-bis(octylthiomethyl)-o-cresol, manufactured by BASF SE), Irganox 3125 (manufactured by BASF SE), Irganox 565 (2,4-bis(n-octylthio)-6-(4-hydroxy 3',5'-di-t-butylanilino)-1,3,5-triazine, manufactured by BASF SE), Adekastab (registered trademark) AO-80 (3,9-bis(2-(3-(3-t-butyl-4-hydroxy-5-methylphenyl)propionyloxy)-1,1-dimethylethyl)-2,4,8,10-tetraoxaspiro(5,5)undecane, manufactured by Adeka Corporation), Sumilizer (registered trademark) BHT, Sumilizer GA-80 and Sumilizer GS (these are manufactured by Sumitomo Chemical Co., Ltd.), Cyanox (registered trademark) 1790 (manufactured by Cytec Industries Inc.), and vitamin E (manufactured by Eisai Co., Ltd.).

The phenol-based antioxidant is preferably an antioxidant having a hindered phenol structure in which a bulky organic group is bound at at least one ortho-position of a phenolic hydroxy group. The bulky organic group is preferably a secondary or tertiary alkyl group, and specific examples thereof include an isopropyl group, a s-butyl group, a t-butyl group, a s-amyl group, and a t-amyl group. In particular, a tertiary alkyl group is preferable, and a t-butyl group or a t-amyl group is particularly preferable.

Examples of the phosphorus-based antioxidant include Irgafos (registered trademark) 168 (tris(2,4-di-t-butylphenyl)phosphite, manufactured by BASF SE), Irgafos 12 (tris [2-[[2,4,8,10-tetra-t-butyldibenzo[d,f][1,3,2]dioxaphosphin-6-yl]oxy]ethyl]amine, manufactured by BASF SE), Irgafos 38 (bis(2,4-bis(1,1-dimethylethyl)-6-methylphenyl)ethyl ester phosphorus acid, manufactured by BASF SE), Adekastab (registered trademark) 329K, Adekastab PEP36 and Adekastab PEP-8 (these are manufactured by Adeka Corporation), Sandstab P-EPQ (manufactured by Clariant AG), Weston (registered trademark) 618 and Weston 619G (these are manufactured by GE), Ultranox 626 (manufactured by GE), and Sumilizer (registered trademark) GP (6-[3-(3-t-butyl-4-hydroxy-5-methylphenyl)propoxy]-2,4,8,10-tetra-t-butyldibenz [d, f][1.3.2]dioxaphosphepine) (manufactured by Sumitomo Chemical Co., Ltd.).

The phosphorus-based antioxidant is preferably an antioxidant having a group represented by the following formula (e1).

[Formula 4]

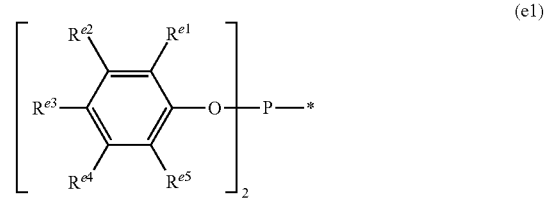

In the formula (e1), $R^{e1}$ to $R^{e5}$ each independently represent a hydrogen atom or an alkyl group, and * represents a bonding hand.

$R^{e1}$ is preferably a hydrogen atom or an alkyl group having 1 to 4 carbon atoms, more preferably a hydrogen atom, a methyl group, an ethyl group, or a t-butyl group.

$R^{e2}$ and $R^{e4}$ are each preferably a methyl group or a hydrogen atom, more preferably a hydrogen atom.

Res and $R^{e3}$ are each independently preferably an alkyl group, more preferably a secondary or tertiary alkyl group, further preferably a t-butyl group or a t-amyl group.

Two units parenthesized are optionally bound at $R^{e1}(s)$ thereof to form a ring. Such binding at $R^{e1}(s)$ refers to a mode of binding of groups, where a hydrogen atom is excluded from each of these $R^{e1}(s)$, and, for example, in a case where both these two $R^{e1}(s)$ are hydrogen atoms, such binding refers to a mode of direct binding of a carbon atom to which $R^{e1}$ on one benzene ring is bound and a carbon atom to which $R^{e1}$ on another benzene ring is bound.

Examples of the sulfur-based antioxidant include a dialkylthiodipropionate compound such as dilauryl, dimyristyl or distearyl thiodipropionate, and a β-alkylmercaptopropionic acid ester compound of polyol, such as tetrakis[methylene(3-dodecylthio)propionate]methane.

The light stabilizer is not particularly limited as long as it is a light stabilizer industrially commonly used, and, for example, a hindered amine-based light stabilizer can be used. Examples of the hindered amine-based light stabilizer include Adekastab (registered trademark) LA-52, Adekastab LA-57, Adekastab LA-63P, Adekastab LA-68, Adekastab LA-72, Adekastab LA-77Y, Adekastab LA-77G, Adekastab LA-81, Adekastab LA-82, Adekastab LA-87, Adekastab LA-402AF, Adekastab LA-40MP and Adekastab LA-40Si (these are manufactured by Adeka Corporation), and Chimassorb (registered trademark) 944FDL, Chimassorb 2020FDL and TINUVIN 622SF (these are manufactured by BASF SE).

The stabilizer (E) is preferably an antioxidant, more preferably a phenol-based antioxidant or a phosphorus-based antioxidant, more preferably an antioxidant having at least one of the hindered phenol structure and the group represented by the formula (e1), further preferably an antioxidant having both the hindered phenol structure and the group represented by the formula (e1), particularly preferably Sumilizer (registered trademark) GP.

The content of the stabilizer (E) is, for example, 1% by mass or more, or may be 2% by mass or more, and may be, for example, 60% by mass or less, or is preferably 50% by mass or less, more preferably 40% by mass or less, further preferably 30% by mass or less, based on the total amount of the photosensitive composition.

The content of the stabilizer (E) is preferably 8% by mass or more, more preferably 9% by mass or more, further preferably 12% by mass or more, particularly preferably 16% by mass or more based on the total amount of the photosensitive composition, from the viewpoint of an enhancement in heat resistance. The content of the stabilizer (E) may be, for example, 60% by mass or less, or is preferably 50% by mass or less, more preferably 40% by mass or less, further preferably 30% by mass or less, still further preferably 20% or less, particularly preferably 18% by mass or less based on the total amount of the photosensitive composition, from the viewpoint of a reduction in viscosity.

<Solvent (F)>

The photosensitive composition of the present invention may include a solvent (F), and in a case where the solvent (F) is included, the content thereof is more preferably lower. In a case where the solvent (F) is included in the photosensitive composition, the content thereof is preferably 10% by mass or less, more preferably 5% by mass or less, further preferably 3.5% by mass or less, particularly preferably 3.2% by mass or less, or may be 0% by mass, and may be 0.5% by mass or more, or may be 1% by mass or more, based on the total amount of the photosensitive composition. The content of the solvent (F) can be decreased to thereby allow control of the thickness in formation of a cured film to be facilitated and also allow the production cost and the burdens on the global environment and the working environment to be reduced.

Examples of the solvent (F) include an ester solvent (solvent containing —C(=O)—O—), an ether solvent (solvent containing —O—) other than an ester solvent, an ether ester solvent (solvent containing —C(=O)—O— and —O—), a ketone solvent (solvent containing —C(=O)—) other than an ester solvent, an alcohol solvent, an aromatic hydrocarbon solvent, an amide solvent, and dimethylsulfoxide.

Examples of the ester solvent include methyl lactate, ethyl lactate, butyl lactate, methyl 2-hydroxyisobutanoate, ethyl acetate, n-butyl acetate, isobutyl acetate, pentyl formate, isopropyl acetate, butyl propionate, isopropyl butyrate, ethyl butyrate, butyl butyrate, methyl pyruvate, ethyl pyruvate, propyl pyruvate, methyl acetoacetate, ethyl acetoacetate, and γ-butyrolactone.

Examples of the ether solvent include ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monopropyl ether, propylene glycol monobutyl ether, 3-methoxy-1-butanol, 3-methoxy-3-methylbutanol, tetrahydrofuran, tetrahydropyran, 1,4-dioxane, diethylene glycol dimethyl ether, diethylene glycol diethyl ether, diethylene glycol methyl ethyl ether, diethylene glycol dipropyl ether, diethylene glycol dibutyl ether, anisole, phenetole, and methylanisole.

Examples of the ether ester solvent include methyl methoxyacetate, ethyl methoxyacetate, butyl methoxyacetate, methyl ethoxyacetate, ethyl ethoxyacetate, methyl 3-methoxy propionate, ethyl 3-methoxypropionate, methyl 3-ethoxypropionate, ethyl 3-ethoxypropionate, methyl 2-methoxypropionate, ethyl 2-methoxypropionate, propyl 2-methoxypropionate, methyl 2-ethoxypropionate, ethyl 2-ethoxypropionate, methyl 2-methoxy-2-methylpropionate, ethyl 2-ethoxy-2-methylpropionate, 3-methoxybutyl acetate, 3-methyl-3-methoxybutyl acetate, propylene glycol monomethyl ether acetate, propylene glycol monoethyl ether acetate, propylene glycol monopropyl ether acetate, ethylene glycol monomethyl ether acetate, ethylene glycol monoethyl ether acetate, diethylene glycol monoethyl ether acetate, diethylene glycol monobutyl ether acetate, and dipropylene glycol methyl ether acetate.

Examples of the ketone solvent include 4-hydroxy-4-methyl-2-pentanone, acetone, 2-butanone, 2-heptanone, 3-heptanone, 4-heptanone, 4-methyl-2-pentanone, cyclopentanone, cyclohexanone, and isophorone.

Examples of the alcohol solvent include methanol, ethanol, propanol, butanol, hexanol, cyclohexanol, ethylene glycol, propylene glycol, and glycerin.

Examples of the aromatic hydrocarbon solvent include benzene, toluene, xylene, and mesitylene.

Examples of the amide solvent include N,N-dimethylformamide, N,N-dimethylacetamide, and N-methylpyrrolidone.

The solvent (F) is preferably the ester solvent, the ether ester solvent, the alcohol solvent, or the amide solvent, more preferably the ether ester solvent.

<Leveling Agent (G)>

The photosensitive composition of the present invention may further include a leveling agent (G). Examples of the leveling agent (G) include a silicone-based surfactant, a fluorine-based surfactant, and a silicone-based surfactant having a fluorine atom. Such an agent also optionally has a polymerizable group in a side chain.

Examples of the silicone-based surfactant include a surfactant having a siloxane bond in its molecule. Specific examples include Toray silicone DC3PA, Toray silicone SH7PA, Toray silicone DC11PA, Toray silicone SH21PA, Toray silicone SH28PA, Toray silicone SH29PA, Toray silicone SH30PA and Toray silicone SH8400 (trade names: manufactured by Toray Dow Corning, Co., Ltd.), KP321, KP322, KP323, KP324, KP326, KP340 and KP341 (manufactured by Shin-Etsu Chemical Co., Ltd.), and TSF400, TSF401, TSF410, TSF4300, TSF4440, TSF4445, TSF4446, TSF4452 and TSF4460 (manufactured by Momentive Performance Materials Japan LLC).

Examples of the fluorine-based surfactant include a surfactant having a fluorocarbon chain in its molecule. Specific examples include Fluorad (registered trademark) FC430 and Fluorad FC431 (manufactured by Sumitomo 3M Limited), Megaface (registered trademark) F142D, Megaface F171, Megaface F172, Megaface F173, Megaface F177, Megaface F183, Megaface F554, Megaface R30 and Megaface RS-718-K (manufactured by DIC Corporation), Eftop (registered trademark) EF301, Eftop EF303, Eftop EF351 and Eftop EF352 (manufactured by Mitsubishi Materials Electronic Chemicals Co., Ltd.), Surflon (registered trademark) S381, Surflon S382, Surflon SC101 and Surflon SC105 (manufactured by AGC Inc.), and E5844 (manufactured by Daikin Fine Chemicals & Intermediates).

Examples of the silicone-based surfactant having a fluorine atom include a surfactant having a siloxane bond and a fluorocarbon chain in its molecule. Specific examples include Megaface (registered trademark) R08, Megaface BL20, Megaface F475, Megaface F477 and Megaface F443 (manufactured by DIC Corporation).

The content of the leveling agent (G) is usually 0.001% by mass or more and 0.5% by mass or less, preferably 0.005% by mass or more and 0.3% by mass or less, more preferably 0.01% by mass or more and 0.2% by mass or less based on the total amount of the photosensitive composition.

The photosensitive composition of the present invention is a photosensitive composition including the semiconductor particle (A), the photopolymerizable compound (C) and the photopolymerization initiator (D), in which the photopolymerizable compound (C) includes the compound (C1) and/or the compound (C2), or includes 8% by mass or more of the stabilizer (E) based on the total amount of the photosensitive composition. The photosensitive composition of the present invention preferably includes all the compound (C1), the compound (C2), and the stabilizer (E) in a predetermined amount or more.

The photosensitive composition, which includes the compound (C1) and/or the compound (C2), thus can be reduced in viscosity. While the photosensitive composition, when includes the compound (C1) and/or the compound (C2), may cause deterioration in heat resistance, such deterioration in heat resistance can be suppressed by addition of the stabilizer (E) in a predetermined amount or more.

The photosensitive composition preferably further includes the compound (C3). The photosensitive composition, which includes the compound (C3), thus allows for suppression of semiconductor particle aggregation and an enhancement in semiconductor particle dispersibility, resulting in a more enhancement in light conversion efficiency of a cured film obtained from the photosensitive composition. While the photosensitive composition, when includes the compound (C3), may be easily increased in viscosity, such an increase in viscosity is suppressed because the photosensitive composition includes the compound (C1) and/or the compound (C2). Although deterioration in heat resistance may be easily caused by allowing the compound (C1) and/or the compound (C2) to be included for a reduction in viscosity, such deterioration in heat resistance can be suppressed because the stabilizer (E) is contained in a predetermined amount or more as described above.

The content of the semiconductor particle (A) in the photosensitive composition is preferably 16% by mass or more and 45% by mass or less based on the total amount of the photosensitive composition. When the content of the semiconductor particle (A) is the above range, a cured film achieves a sufficient light conversion efficiency.

The viscosity at 40° C. of the photosensitive composition of the present invention is preferably 20 cP or less, more preferably 15 cP or less, further preferably 10 cP or less. The lower limit is not particularly limited, and may be 2 cP or more, or may be 3 cP or more or may be 5 cP or more. The viscosity of the photosensitive composition is in the above range to result in an enhancement in coatability. In particular, the viscosity of the photosensitive composition is in the above range, to thereby enable the photosensitive composition to be smoothly discharged through a discharge head of an ink-jet printer and be suitably used as an ink for an ink-jet printer.

In the case of use as an ink for an ink-jet printer, the photosensitive composition of the present invention can be discharged at a temperature of 40° C. or more through a discharge head of an ink-jet printer. The photosensitive composition of the present invention may also be excellent in heat resistance, and a cured film obtained is favorable in physical properties (in particular, light conversion efficiency) even in the case of discharge in a condition of a temperature of the photosensitive composition of 40° C. or more. The temperature of the photosensitive composition in discharge through a discharge head of an ink-jet printer may be 50° C. or less, may be 60° C. or less or may be 80° C. or less.

Additive(s) such as a dispersant, a plasticizer, and/or a filler may be, if necessary, used as other component(s) in the photosensitive composition of the present invention.

Examples of the dispersant include cationic, anionic, nonionic, amphoteric, polyester-based, polyamine-based, and acrylic surfactants, but not limited thereto. The dispersant is preferably used in combination when the photosensitive composition contains the light scattering agent (B). The photosensitive composition, which contains the dispersant, thus allows the light scattering agent (B) in the photosensitive composition to be enhanced in dispersibility.

In a case where the dispersant is included in the photosensitive composition, the content thereof is preferably 10% by mass or less, more preferably 5% by mass or less, further preferably 3% by mass or less, particularly preferably 1% by mass or less, or may be 0% by mass, and may be 0.1% by mass or more or may be 0.3% by mass or more, based on the total amount of the photosensitive composition. The content is preferably 3% by mass or less, more preferably 2% by mass or less, particularly preferably 1% by mass or less, from the viewpoint of a reduction in viscosity.

The content of such additive(s) is preferably 10% by mass or less, more preferably 5% by mass or less, further preferably 3% by mass or less, particularly preferably 1% by mass or less, or may be 0% by mass based on the total amount of the photosensitive composition.

<Method for Producing Photosensitive Composition>

The photosensitive composition of the present invention can be prepared by mixing the semiconductor particle (A), the photopolymerizable compound (C), the photopolymerization initiator (D), and the light scattering agent (B), the stabilizer (E), the solvent (F), the leveling agent (G) and/or other additive(s), if necessary, used.

The mixing order of each of the components is not particularly limited, and preferably, a dispersion liquid obtained by mixing the semiconductor particle (A) and the photopolymerizable compound (C) and a light scattering agent solution obtained by mixing the light scattering agent (B) and the solvent (F) are prepared in advance, and the resulting dispersion liquid and light scattering agent solution, and other components are mixed.

The ligand-containing semiconductor particle as the semiconductor particle (A) may be, for example, obtained by providing or preparing a semiconductor particle to which an organic ligand is coordinated, and then subjecting the semiconductor particle to a ligand reduction treatment for a reduction in amount of the organic ligand coordinated. Such a ligand reduction treatment can be, for example, a treatment for extracting the organic ligand coordinated to the semiconductor particle in a proper solvent.

<Cured Film, Cured Film Patterned, Wavelength Conversion Film, and Display Device>

A cured film can be obtained by curing a film (layer) of the photosensitive composition. Specifically, such a cured film can be obtained by coating a substrate with the photosensitive composition to form a coating film, and exposing the resulting coating film.

The base plate here used can be, for example, a glass plate such as quartz glass, borosilicate glass, aluminosilicate glass, or soda-lime glass whose surface is coated with silica, a plate of a resin such as polycarbonate, polymethyl methacrylate or polyethylene terephthalate, silicon, or the base plate on which an aluminum, silver or silver/copper/palladium alloy thin film is formed.

In coating with the photosensitive composition, for example, various printing methods such as a gravure printing method, an offset printing method, a relief printing method, a screen printing method, a transfer printing method, an electrostatic printing method and a plateless printing method, coating methods such as a gravure coating method, a roll coating method, a knife coating method, an air-knife coating method, a bar coating method, a dip coating method, a kiss coating method, a spray coating method, a die coating method, a comma coating method, an ink-jet method, a spin coating method and a slit coating method, and combinations thereof can be each appropriately used.

The light source for use in exposure is preferably a light source which emits light at a wavelength of 250 nm or more and 450 nm or less. For example, light at less than 350 nm may be blocked by using a filter which blocks light in this wavelength region, or light around 436 nm, light around 408 nm and light around 365 nm may be selectively extracted by using a bandpass filter which extracts light in these wavelength regions. Examples of the light source include a mercury lamp, a light-emitting diode, a metal halide lamp, and a halogen lamp.

A cured film patterned can be formed from the photosensitive composition by patterning according to a method such as a photolithography method, an ink-jet method, or a printing method. Since a photolithography method causes loss of an expensive composition material, an ink-jet method is preferably adopted from the viewpoint of reducing loss of the material.

Examples of the method for producing the cured film patterned according to an ink-jet method include a method involving forming a bank on a substrate, then selectively attaching the photosensitive composition onto a region defined by the bank on the substrate, according to an ink-jet method, and curing the photosensitive composition by exposure.

The base plate here used can be the substrate exemplified in the description of the method for producing the cured film.

Examples of the method for forming the bank include a photolithography method and an ink-jet method, and the bank is preferably formed according to an ink-jet method.

Examples of the ink-jet method include a Bubble Jet (registered trademark) system with an electrothermal converter as an energy generating element, or a piezo-jet system with a piezoelectric element.

The light source for use in exposure can be the light source exemplified in the description of the method for producing the cured film.

The cured film not patterned or the cured film patterned can be suitably used as a wavelength conversion film (wavelength conversion filter) which emits light different in wavelength from light which is incident from, for example, a light-emitting section such as a LED. In particular, the cured film patterned is preferably located above a light-emitting element corresponding to each pattern, such as a LED. Such each light-emitting element can be individually subjected to wavelength conversion to thereby provide appropriate shapes of emission spectra of red, green, blue, and the like and allow for high color reproducibility. A display member including a wavelength conversion film can be suitably used in a display device such as a liquid crystal display device or an organic EL device.

FIG. 1 is a schematic cross-sectional view of one embodiment of a display member formed according to an ink-jet method. A display member 10 of FIG. 1 includes a bank 2 formed on a base plate 1 and a light-emitting element 3 disposed between such banks 2, such as a LED, and includes a cured film 4 (wavelength conversion film) (hereinafter, each cured film patterned to the size between such banks 2 may be sometimes referred to as "cured film pixel") obtained by attaching the photosensitive composition of the present invention onto the light-emitting element 3 between such banks 2 according to an ink-jet method and then curing the composition. A color filter 5, a gas barrier layer 6, and the like may be located on such each cured film pixel 4.

Such each cured film pixel 4 can be formed according to an ink-jet method to thereby allow for patterning at a relatively large size, and suitable application to a large-sized display such as a digital signage can be achieved.

Accordingly, when an ink-jet method is adopted, the vertical dimension (L1) of such each cured film pixel 4 formed from the photosensitive composition of the present invention is preferably 9 µm or more, more preferably 12 µm or more, further preferably 15 µm or more, and may be 40 µm or less or may be 30 µm or less. The vertical dimension (L1) may be here the same in length as the horizontal dimension (L3) of the light-emitting element.

When an ink-jet method is adopted, the horizontal dimension (L2) of such each cured film pixel 4 formed from the photosensitive composition of the present invention is preferably 10 µm or more, more preferably 30 µm or more, further preferably 50 µm or more, still further preferably 80 µm or more, particularly preferably 100 µm or more, and may be 900 µm or less, may be 800 µm or less or may be 700 µm or less.

The vertical dimension (L1) of such each cured film pixel 4 is the dimension in the substrate thickness direction, of a cross section cut out in the perpendicular direction to the base plate. The cross section is cut out at a location where the vertical dimension of such each cured film pixel 4 is the maximum dimension. FIG. 1 illustrates a cross section cut out in the perpendicular direction to the substrate, at a location where the vertical dimension of such each cured film pixel 4 is the maximum dimension.

The horizontal dimension (L2) of such each cured film pixel 4 is the maximum dimension of such each cured film pixel 4 in the horizontal direction to the substrate, and refers to a dimension (planar-view dimension) when the substrate is viewed in the perpendicular direction.

The horizontal dimension (L3) of the light-emitting element is the maximum dimension of the light-emitting element in the horizontal direction to the substrate, and refers to a dimension (planar-view dimension) when the substrate is viewed in the perpendicular direction.

The stabilizer (E) included in the cured film can be confirmed by analysis of the cured film with thermal desorption GC/MS. Thermal desorption conditions and detection conditions of the stabilizer (E), here used, can be conditions described in Examples below. The stabilizer (E) included in the cured film can be confirmed by the appearance of a MS spectrum assigned to a specified molecule structure of the stabilizer (E) in thermal desorption GC/MS of the cured film.

EXAMPLES

Hereinafter, the present invention is more specifically described with reference to Examples, but the present invention is not limited to the following Examples at all and can also be, of course, carried out with being modified within the scope adaptable to the spirit of the description above and below, and all such modifications are encompassed within the technical scope of the present invention. Hereinafter, "part(s)" means "part(s) by mass" and "%" means "% by mass", unless not particularly noted.

The following materials were used in Examples and Comparative Examples.

Quantum dot dispersion liquid 1: toluene dispersion liquid of quantum dot including organic ligand and having InP/ZnSeS structure (maximum peak wavelength of emission spectrum being 530 nm and full width at half maximum being 42 nm)

Quantum dot dispersion liquid 2: toluene dispersion liquid of quantum dot including organic ligand and having InP/ZnSeS structure (maximum peak wavelength of emission spectrum being 630 nm and full width at half maximum being 42 nm)
Photopolymerizable compound (C3-1): pentaerythritol succinic acid monoester
Photopolymerizable compound (C-2): ω-carboxy-polycaprolactone (n≈2) monoacrylate (Aronix (registered trademark) M-5300 manufactured by Toagosei Co., Ltd.)
Photopolymerizable compound (C-3): glycerin triacrylate (Aronix (registered trademark) MT-3547 manufactured by Toagosei Co., Ltd.)
Photopolymerizable compound (C-4): isobornyl acrylate
Photopolymerizable compound (C2-5): 2-(2-vinyloxyethoxy)ethyl acrylate (VEEA (registered trademark) manufactured by Nippon Shokubai Co., Ltd.)
Photopolymerizable compound (C1-6): ethyl methacrylate (Light Ester E manufactured by Kyoeisha Chemical Co., Ltd., viscosity at 25° C.: 0.7 cP)
Photopolymerization initiator (D-1): OMNIRAD (registered trademark) 907 manufactured by IGM Resins B.V.
Photopolymerization initiator (D-2): OMNIRAD (registered trademark) 369 manufactured by IGM Resins B.V.
Stabilizer (E-1): Sumilizer (registered trademark) GP manufactured by Sumitomo Chemical Co., Ltd.
Solvent (F-1): propylene glycol monomethyl ether acetate (hereinafter, referred to as "PGMEA")
Leveling agent (G-1): Megaface (registered trademark) F-554 manufactured by DIC Corporation <Preparation of Quantum Dot 1>

A dried product of quantum dot 1 was obtained by removing toluene from quantum dot dispersion liquid 1 by distillation under reduced pressure.

<Preparation of Quantum Dot 2>

A dried product of quantum dot 2 was obtained by removing toluene from quantum dot dispersion liquid 2 by distillation under reduced pressure.

<Preparation of Light Scattering Agent Solution>

Ten parts (in terms of solid content) of a dispersant and 30 parts in total of PGMEA were mixed with 60 parts of a titanium oxide particle (median size on volume basis: 0.23 μm), and the titanium oxide particle was sufficiently dispersed with a bead mill.

Example 1

A photopolymerizable compound described in Table 1 was charged to quantum dot 1 described above and the resultant was stirred with an ultrasonic washing machine and a touch mixer until the solid content disappeared, to thereby obtain a quantum dot monomer dispersion liquid. The light scattering agent solution, the photopolymerization initiator, the stabilizer and the leveling agent were charged to the dispersion liquid obtained so that the formulation described in Table 1 was achieved, and the resultant was stirred by a touch mixer, to thereby obtain a quantum dot ink.

Examples 2 to 14 and Comparative Examples 1 to 3

Each quantum dot ink was obtained by the same method as in Example 1 except that the types and the amounts of the semiconductor particle, the light scattering agent, the photopolymerizable compound, the photopolymerization initiator, the stabilizer, the leveling agent and the solvent were changed as in the formulation described in Table 1.

TABLE 1

|  |  |  |  | Example | | | | | | | | |
|---|---|---|---|---|---|---|---|---|---|---|---|---|
|  |  |  |  | 1 | 2 | 3 | 4 | 5 | 6 | 7 | 8 | 9 |
| Formulation (parts) | Semiconductor particle (A) | Quantum dot 1 | | 14.7 | 14.7 | 29.1 | 29.1 | 29.1 | 29.1 | 29.1 | 29.1 | |
|  |  | Quantum dot 2 | | | | | | | | | | 29.1 |
|  | Light scattering agent (B) | Titanium oxide | | 2.9 | 2.9 | 5.8 | 5.8 | 5.8 | 5.8 | 5.8 | 5.8 | 5.8 |
|  | Photopolymerizable compound (C) | | (C3-1) | 5.5 | 15.5 | 12.0 | 16.2 | 14.9 | 11.6 | 14.3 | 13.3 | 16.2 |
|  |  | | (C-2) | | | | | | | | | |
|  |  | | (C-3) | 27.7 | | | | | | | | |
|  |  | | (C-4) | 22.2 | 36.3 | 12.0 | 16.2 | 14.9 | 11.6 | 14.3 | 13.3 | 16.2 |
|  |  | | (C2-5) | | | | | | | | | |
|  |  | | (C1-6) | | | 16.0 | 21.6 | 19.8 | 15.5 | 19.1 | 17.7 | 21.6 |
|  | Photopolymerization initiator (D) | | (D-1) | 22.2 | 25.9 | 20.0 | 5.4 | 9.9 | 3.9 | 4.8 | 4.4 | 5.4 |
|  |  | | (D-2) | | | | | | | | | |
|  | Stabilizer (E) | | (E-1) | 2.8 | 2.6 | 2.0 | 2.7 | 2.5 | 19.4 | 9.5 | 13.3 | 2.7 |
|  | Leveling agent (G) | | (G-1) | 0.1 | 0.1 | 0.1 | 0.1 | 0.1 | 0.1 | 0.1 | 0.1 | 0.1 |
|  | Solvent (F) | | (F-1) | 1.9 | 1.9 | 3.0 | 3.0 | 3.0 | 3.0 | 3.0 | 3.0 | 3.0 |
| Evaluation | Curability | | | ○ | ○ | ○ | ○ | ○ | ○ | ○ | ○ | ○ |
|  | External quantum yield | | | Δ | ○ | ○ | ○ | ○ | ○ | ○ | ○ | ○ |
|  | Conversion efficiency | | | ○ | ○ | ○ | ○ | ○ | ○ | ○ | ○ | ○ |
|  | Viscosity (cP) at 40° C. | | | Δ | Δ | ○ | ⊙ | ⊙ | Δ | ⊙ | ⊙ | ○ |
|  | Heat resistance | | | C | C | C | C | B | S | A | A | C |

|  |  |  |  | Example | | | | | Comparative Example | | |
|---|---|---|---|---|---|---|---|---|---|---|---|
|  |  |  |  | 10 | 11 | 12 | 13 | 14 | 1 | 2 | 3 |
| Formulation (parts) | Semiconductor particle (A) | Quantum dot 1 | | 29.1 | 29.1 | 29.1 | 29.1 | 29.1 | 29.0 | 29.0 | 29.0 |
|  |  | Quantum dot 2 | | | | | | | | | |
|  | Light scattering agent (B) | Titanium oxide | | 5.8 | 5.8 | 5.8 | 5.8 | 5.8 | 6.8 | 6.8 | 6.8 |

TABLE 1-continued

| | | | | | | | | | | |
|---|---|---|---|---|---|---|---|---|---|---|
| | Photopolymerizable compound (C) | (C3-1) | | | 11.6 | 11.6 | 11.6 | | | 10.8 |
| | | (C-2) | 11.6 | 11.6 | | | | | 10.8 | |
| | | (C-3) | | | | | | 45.7 | 43.1 | 43.1 |
| | | (C-4) | 27.1 | 11.6 | 27.1 | 11.6 | | 8.1 | | |
| | | (C2-5) | | | | | | | | |
| | | (C1-6) | | 15.5 | | 15.5 | 27.1 | | | |
| | Photopolymerization initiator (D) | (D-1) | 3.9 | 3.9 | 3.9 | | 3.9 | 4.3 | 4.3 | 4.3 |
| | | (D-2) | | | | 3.9 | | | | |
| | Stabilizer (E) | (E-1) | 19.4 | 19.4 | 19.4 | 19.4 | 19.4 | 2.7 | 2.7 | 2.7 |
| | Leveling agent (G) | (G-1) | 0.1 | 0.1 | 0.1 | 0.1 | 0.1 | 0.1 | 0.1 | 0.1 |
| | Solvent (F) | (F-1) | 3.0 | 3.0 | 3.0 | 3.0 | 3.0 | 3.3 | 3.3 | 3.3 |
| Evaluation | Curability | | ○ | ○ | ○ | ○ | ○ | ○ | X | ○ |
| | External quantum yield | | Δ | ○ | ○ | ○ | ○ | X | — | X |
| | Conversion efficiency | | ○ | ○ | ○ | ○ | ○ | X | — | Δ |
| | Viscosity (cP) at 40° C. | | ⊙ | ○ | X | ⊙ | ⊙ | — | X | X |
| | Heat resistance | | C | C | S | S | A | C | C | C |

Evaluation Tests (1) Curability Test

A 5-cm square glass base plate (Eagle 2000; manufactured by Corning Incorporated) was coated with the quantum dot ink according to a spin coating method, and thereafter the resultant was irradiated with light at an amount of exposure of 200 mJ/cm$^2$ (365 nm basis) by use of an exposure machine (TME-150RSK; manufactured by Topcon Corporation) under the air atmosphere. After the irradiation with light, a case where a cured film was obtained was rated as "○", and a case where a liquid state was observed even after the irradiation with light was rated as "x". The results are shown in Table 1.

(2) Measurement of External Quantum Yield

An optical system 10a illustrated in FIG. 2 was used to evaluate the Incident photon number. In the optical system 10a, a light diffusion plate disposed on a base plate where each blue light-emitting diode exhibiting a maximum peak wavelength at 445 nm was aligned was adopted as a backlight 11a. A glass base plate 12a before coating with a cured film was placed on the backlight 11a, an electronic cooling backside incident type high S/N fiber multi-channel spectroscope QE65Pro (manufactured by Ocean Optics Inc.) provided with an optical fiber was disposed upward in the perpendicular direction, of a surface of the base plate, and a spectrum was measured. The distance between a surface of the base plate 12a and a spectroscopic detector 13a was fixed to 5 cm. The Incident photon number was obtained according to expression 1 with respect to spectrum I (λ) obtained.

[Expression 1]

$$\text{Incident photon number} = \int_{350}^{505} \frac{I(\lambda)}{(1239.84/\lambda) \times 1.60218 \times 10^{-19}} d\lambda \qquad \text{Expression 1}$$

Next, an optical system 10b illustrated in FIG. 3 was used to evaluate the Emitted photon number. In the optical system 10b, a light diffusion plate disposed on a base plate where each blue light-emitting diode exhibiting a maximum peak wavelength at 445 nm was aligned was adopted as a backlight 11b. A base plate 12b including a cured film 14 produced in the curability test was placed on the backlight 11b, an electronic cooling backside incident type high S/N fiber multi-channel spectroscope QE65Pro (manufactured by Ocean Optics Inc.) provided with an optical fiber was disposed upward in the perpendicular direction, of a surface of the base plate, and a spectrum was measured. The distance between a surface of the cured film 14 and a spectroscopic detector 13b was fixed to 5 cm. The Emitted photon number was obtained according to expression 2 with respect to spectrum I (λ) obtained.

[Expression 2]

$$\text{Emitted photon number} = \int_{485}^{950} \frac{I(\lambda)}{(1239.84/\lambda) \times 1.60218 \times 10^{-19}} d\lambda \qquad \text{Expression 2}$$

The external quantum yield was obtained from the above Incident photon number and Emitted photon number, according to expression 3. An external quantum yield of less than 20% was rated as "x", an external quantum yield of 20% or more and less than 26% was rated as "Δ", and an external quantum yield of 26% or more was rated as "○". The results are shown in Table 1.

[Expression 3]

$$\text{External quantum yield} = \text{Emitted photon number}/\text{Incident photon number} \qquad \text{Expression 3}$$

(3) Measurement of Conversion Efficiency

The base plate including the cured film produced in the curability test was cut to 1-cm square, to thereby obtain a sample for conversion efficiency evaluation. The sample for conversion efficiency evaluation was subjected to conversion efficiency measurement with an absolute PL quantum yield measurement device (trade name C9920-02 manufactured by Hamamatsu Photonics K.K., exciting light 450 nm, room temperature, under atmosphere). A conversion efficiency of 45% or more was rated as "○", a conversion efficiency of 35% or more and less than 45% was rated as "Δ", and a conversion efficiency of less than 35% was rated as "x". The results are shown in Table 1.

(4) Measurement of Viscosity

The viscosity at 40° C. of the quantum dot ink was measured with a digital viscometer (model: DV2T) from Brookfield Asset Management Inc. A viscosity of the quantum dot ink of less than 14 cP was rated as "⊙", a viscosity of the quantum dot ink of 14 cP or more and less than 16 cP was rated as "○", a viscosity of the quantum dot ink of 16 cP or more and 20 cP or less was rated as "Δ", and a viscosity of the quantum dot ink of more than 20 cP was rated as "x". The results are shown in Table 1.

(5) Heat Resistance Test

The cured film obtained in the curability test was heated in an oven at 80° C. for 3 days. A case where the conversion efficiency after the heat resistance test relative to the conversion efficiency before the heat resistance test was 95% or more was rated as "S", 80% or more and less than 95% was rated as "A", 50% or more and less than 80% was rated as "B", and less than 50% was rated as "C". The results are shown in Table 1.

(6) Detection of Stabilizer

Each of the cured films prepared in the curability test of Examples 1 to 14, was analyzed in the following conditions according to thermal desorption GC/MS.

Device: 7890B/5977A (No. 2 device) manufactured by Agilent Technologies

Column: DB-5 (0.25 mm×30 m, membrane thickness: 250 mm)

Carrier gas: He, 1 mL/min

Column temperature: 50° C. (5 minutes)→10° C./min→320° C. (8 minutes)

Detector: EI, m/z 20-600

Inlet temperature: 250° C.

AuX temperature: 250° C.

Split: 50:1

Amount of sample: 300 to 600 mg

Thermal desorption conditions: 180° C. (30 minutes)

The same spectral shape as the shape appeared in measurement of Sumilizer (registered trademark) GP in the above conditions was confirmed in each of the cured films of Examples 1 to 14. Sublimation of Sumilizer (registered trademark) GP from each of the cured films of Examples 1 to 14 in the above thermal desorption conditions was confirmed by the appearance of a MS spectrum assigned to a specified molecule structure of Sumilizer (registered trademark) GP.

REFERENCE SIGNS LIST

10 . . . display member
1 . . . base plate
2 . . . bank
3 . . . light-emitting element
4 . . . cured film (wavelength conversion film)
5 . . . color filter
6 . . . gas barrier layer
L1 . . . vertical dimension
L2 . . . horizontal dimension
L3 . . . horizontal dimension of light-emitting element
10a, 10b . . . optical system
11a, 11b . . . backlight
12a, 12b . . . base plate
13a, 13b . . . spectroscopic detector
14 . . . cured film

The invention claimed is:

1. A photosensitive composition comprising a semiconductor particle (A), a photopolymerizable compound (C), a photopolymerization initiator (D) and a solvent (F), wherein
a content of the solvent (F) is 0.5% by mass or more and 3.5% by mass or less based on the total amount of the photosensitive composition; and
the photopolymerizable compound (C) comprises a compound (C2) having a vinyl ether group and a (meth) acryloyl group in the same molecule, wherein a content of the photopolymerizable compound (C) is 40% by mass or more based on the total amount of the photosensitive composition.

2. The photosensitive composition according to claim 1, wherein the photopolymerizable compound (C) comprises a (meth)acrylate compound (C1) having a molecular weight of 180 or less.

3. The photosensitive composition according to claim 2, wherein the compound (C1) has a viscosity at 25° C. of 1.2 cP or less.

4. The photosensitive composition according to claim 2, wherein a content of the compound (C1) is 5% by mass or more and 50% by mass or less based on the total amount of the photosensitive composition.

5. The photosensitive composition according to claim 1, wherein a content of the compound (C2) is 5% by mass or more and 50% by mass or less based on the total amount of the photosensitive composition.

6. The photosensitive composition according to claim 1, wherein the photosensitive composition comprises a stabilizer (E), and a content of the stabilizer (E) is 8% by mass or more based on the total amount of the photosensitive composition.

7. The photosensitive composition according to claim 6, wherein the content of the stabilizer (E) is 16% by mass or more based on the total amount of the photosensitive composition.

8. The photosensitive composition according to claim 1, wherein a content of the semiconductor particle (A) is 16% by mass or more and 45% by mass or less based on the total amount of the photosensitive composition.

9. The photosensitive composition according to claim 1, wherein the photopolymerizable compound (C) comprises a compound (C3) having a carboxy group and three or more functional groups other than a carboxy group in the same molecule.

10. The photosensitive composition according to claim 9, wherein a content of the compound (C3) is 25 parts by mass or more and 100 parts by mass or less based on 100 parts by mass of the semiconductor particle (A).

11. The photosensitive composition according to claim 1, wherein a viscosity at 40° C. of the photosensitive composition is 20 cP or less.

12. The photosensitive composition according to claim 1, wherein a content of the photopolymerization initiator (D) is 8 parts by mass or more and 50 parts by mass or less based on 100 parts by mass of the photopolymerizable compound (C).

13. The photosensitive composition according to claim 1, wherein the photosensitive composition further comprises a light scattering agent (B) having a median size on a volume basis, of 0.15 μm or more.

14. The photosensitive composition according to claim 1, wherein the photosensitive composition is an ink for an ink-jet printer.

15. A cured film formed from the photosensitive composition according to claim 1.

16. The cured film according to claim 15, having a vertical dimension of 9 μm or more and/or a horizontal dimension of 10 μm or more and 900 μm or less.

17. The photosensitive composition according to claim 1, wherein the photosensitive composition is a liquid composition.

* * * * *